(12) United States Patent
Song et al.

(10) Patent No.: US 9,837,349 B2
(45) Date of Patent: Dec. 5, 2017

(54) SEMICONDUCTOR APPARATUS

(71) Applicant: Samsung Electronics Co., Ltd., Suwon-si, Gyeonggi-do (KR)

(72) Inventors: Ju Hak Song, Hwaseong-si (KR); Sung Min Jo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/092,184

(22) Filed: Apr. 6, 2016

(65) Prior Publication Data

US 2016/0336338 A1    Nov. 17, 2016

(30) Foreign Application Priority Data

May 12, 2015    (KR) .................. 10-2015-0066936

(51) Int. Cl.
*H01L 23/522*    (2006.01)
*H01L 27/11582*    (2017.01)

(52) U.S. Cl.
CPC .... *H01L 23/5226* (2013.01); *H01L 27/11582* (2013.01)

(58) Field of Classification Search
CPC .......... H01L 23/5226; H01L 27/11582; H01L 27/11568; H01L 29/4941; H01L 29/7788; H01L 29/7849
See application file for complete search history.

(56) References Cited

U.S. PATENT DOCUMENTS

| 8,563,378 | B2 | 10/2013 | Shim et al. | |
|---|---|---|---|---|
| 8,653,585 | B2 | 2/2014 | Youm et al. | |
| 2007/0258289 | A1* | 11/2007 | Lue .................. | G11C 16/0466 365/185.18 |
| 2011/0291172 | A1 | 12/2011 | Hwang et al. | |
| 2012/0077320 | A1* | 3/2012 | Shim ................ | H01L 27/11582 438/269 |
| 2012/0098050 | A1 | 4/2012 | Shim et al. | |
| 2012/0280304 | A1 | 11/2012 | Lee et al. | |
| 2013/0168800 | A1* | 7/2013 | Shim .................. | H01L 29/0657 257/499 |
| 2013/0264631 | A1 | 10/2013 | Alsmeier et al. | |

FOREIGN PATENT DOCUMENTS

KR    1020130038032 A    4/2013
KR    1020140093106 A    7/2014

* cited by examiner

*Primary Examiner* — Bilkis Jahan
*Assistant Examiner* — Victor Barzykin
(74) *Attorney, Agent, or Firm* — Ward and Smith, P.A.

(57) ABSTRACT

A semiconductor apparatus includes gate electrodes and interlayer insulating layers alternately stacked on a substrate, channel regions penetrating through the gate electrodes and the interlayer insulating layers, a conductive layer extending from an uppermost layer among the interlayer insulating layers to the substrate by penetrating through the gate electrodes and the interlayer insulating layers between the channel regions, and having an uneven pattern on an outer side wall thereof, a spacer layer disposed on the outer side wall, and a barrier layer disposed on at least one side surface of the spacer layer, wherein the spacer layer and the barrier layer have different etch selectivities.

20 Claims, 20 Drawing Sheets

SEMICONDUCTOR APPARATUS

CROSS-REFERENCE TO RELATED APPLICATION

This application claims the benefit of Korean Patent Application No. 10-2015-0066936 filed on May 13, 2015, with the Korean Intellectual Property Office, the disclosure of which is incorporated herein by reference in its entirety.

BACKGROUND

The present inventive concept relates to a semiconductor apparatus.

Semiconductor apparatuses are used to process increasing amounts of data while being decreased in size. Thus, greater integration is required of semiconductor devices constituting a semiconductor apparatus. In order to enhance integration of semiconductor apparatuses, a semiconductor apparatus having a vertical transistor structure, instead of an existing planar transistor structure, has been proposed.

SUMMARY

An aspect of the present inventive concept can provide a semiconductor apparatus in which the generation of defects is prevented and which has enhanced reliability.

According to an aspect of the present inventive concept, the semiconductor apparatus may include: gate electrodes and interlayer insulating layers alternately stacked on a substrate; channel regions penetrating through the gate electrodes and the interlayer insulating layers; a conductive layer extending from an uppermost layer among the interlayer insulating layers to the substrate by penetrating through the gate electrodes and the interlayer insulating layers between the channel regions, and having an uneven pattern on an outer side wall thereof; a spacer layer disposed on the outer side wall; and a barrier layer disposed on at least one side surface of the spacer layer, wherein the spacer layer and the barrier layer have different etch selectivities.

The barrier layer may be in direct contact with the conductive layer.

The rate of acidification of the barrier layer may be less than that of the spacer layer, i.e., the barrier layer has greater acid resistance than the spacer layer.

The spacer layer may be formed of an oxide.

The barrier layer may be formed of a nitride or an oxynitride.

The acid resistance of the barrier layer may be class A or class AA by ASTM C 282.

The etch rate of the barrier layer by hydrofluoric acid as an etchant may be less than that of the spacer layer.

The thickness of the spacer layer may be greater than that of the barrier layer.

The spacer layer and the barrier layer may not include a material forming the gate electrodes.

According to another aspect of the present inventive concept, the semiconductor apparatus may include: gate electrodes and interlayer insulating layers alternately stacked on a substrate; channel regions penetrating through the gate electrodes and the interlayer insulating layers; a conductive layer extending from an uppermost layer among the interlayer insulating layers to the substrate by penetrating through the gate electrodes and the interlayer insulating layers between the channel regions, and having an uneven pattern on an outer side wall thereof; and a plurality of layers disposed between the conductive layer and the gate electrodes in order to insulate the conductive layer from the gate electrodes, comprising at least one spacer layer and at least one barrier layer, wherein the at least one barrier layer has an etch selectivity different from those of the other layers.

The plurality of layers may include a first spacer layer, a barrier layer and a second spacer layer sequentially disposed on the outer side wall of the conductive layer, wherein the barrier layer may be formed of a material having tolerance to an acidic gas.

The at least one barrier layer may be formed of a material having tolerance to a hydrofluoric acid gas.

The at least one barrier layer may be formed of a nitride or an oxynitride.

The at least one spacer layer may be formed of an oxide.

The plurality of layers may include a plurality of barrier layers and a plurality of spacer layers, each of the plurality of barrier layers may be alternately disposed with each of the plurality of spacer layers, wherein the plurality of barrier layers may be formed of a material having tolerance to an acidic gas.

The plurality of barrier layers may be formed of a nitride or an oxynitride.

The plurality of spacer layers may be formed of an oxide.

According to another aspect of the present inventive concept, provided are methods of manufacturing a semiconductor apparatus in which the generation of defects is prevented and which has enhanced reliability.

BRIEF DESCRIPTION OF DRAWINGS

The above and other aspects, features and advantages of the present inventive concept will be more clearly understood from the following detailed description taken in conjunction with the accompanying drawings.

DETAILED DESCRIPTION

Figure 1:
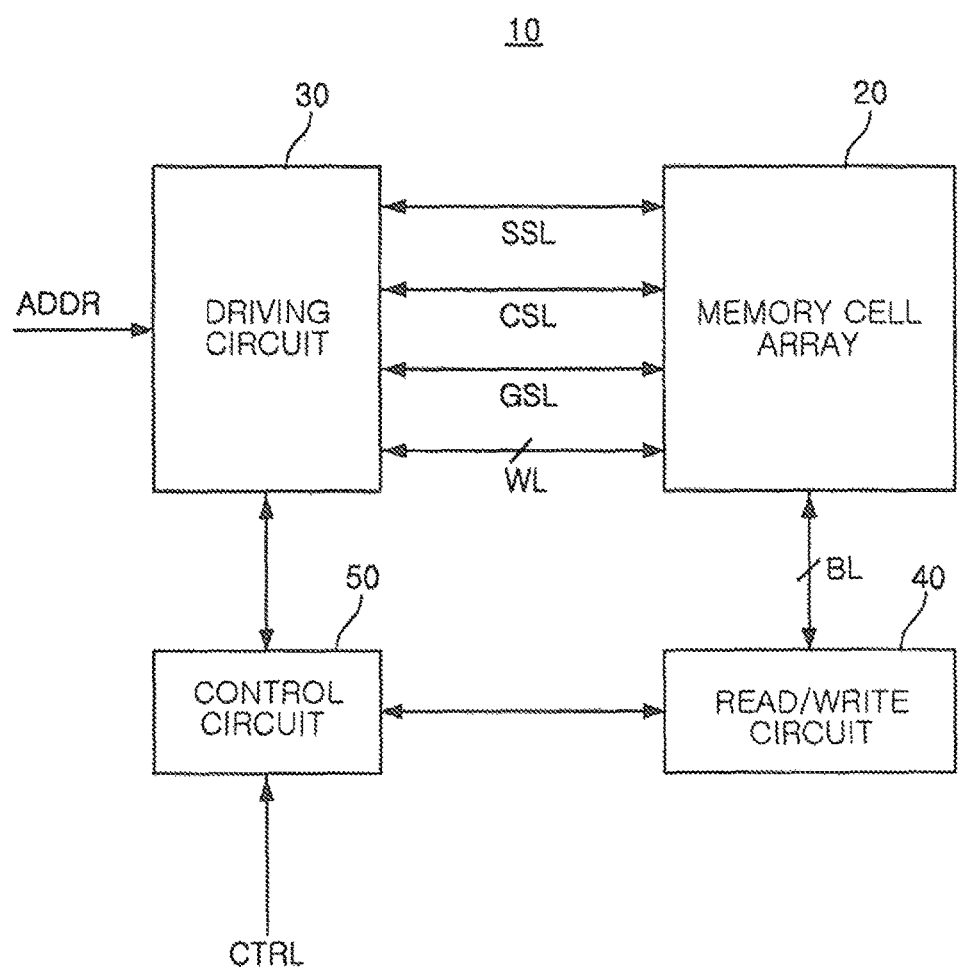
FIG. 1 is a block diagram schematically illustrating a semiconductor apparatus according to an exemplary embodiment of the present inventive concept.

Hereinafter, exemplary embodiments of the present inventive concept will be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art. In the drawings, the shapes, and dimensions of elements may be exaggerated for clarity, and the same reference numerals will be used throughout to designate the same or like elements.

The technical terms used in this disclosure are only used to explain a specific exemplary embodiment while not limiting the present inventive concept. The terms of a singular form, for example, "a", "an" and "the" may include plural forms as well, unless the context clearly indicates otherwise. Also, it will be further understood that the terms "comprise and/or comprising" when used herein, specify the presence of stated features, integers steps, operations, elements, and/or components, but do not preclude the presence or addition of one or more other features, steps, operations, elements, components, and/or groups thereof. As used herein, the term "and/or" includes any one among enumerated items and any combinations thereof.

Also, though terms such as a "first," a "second" and a "third" are used to describe various members, components, regions, layers, and/or portions in various embodiments of the present inventive concept, the members, components, regions, layers, and/or portions are not limited to these terms. These terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion another embodiment, and similarly, a third without departing from the teachings of the present invention. Thus, the terms "first," "second" and "third," etc. are not intended to convey a sequence or other hierarchy to the associated elements but are used for identification purposes only. The sequence of operations (or steps) is not limited to the order presented in the claims or figures unless specifically indicated otherwise.

In the specification, it will be understood that when an element is referred to as being "on," "connected to," etc., another element, layer or substrate, it can be directly on or connected to the other element, or intervening elements may also be present. It will also be appreciated by those of skill in the art that references to a structure or feature that is disposed "adjacent" another feature may have portions that overlap or underlie the adjacent feature.

Spatially relative terms, such as "lower," "bottom," "upper," "top" and the like, may be used herein for ease of description to describe the relationship of one element or feature to another element(s) or feature(s) as illustrated in the figures. It will be understood that the spatially relative terms are intended to encompass different orientations of the device in, use or operation in addition to the orientation depicted in the figures. For example, if the device in the figures is inverted, elements described as at the "bottom" would then be on "top". The device in the figures may be otherwise oriented (rotated 90 degrees or at other orientations) and the spatially relative descriptors used herein interpreted accordingly. Similarly, the terms "uppermost," "lowermost," "vertical" and the like are used herein for the purpose of explanation only unless specifically indicated otherwise.

FIG. 1 is a block diagram schematically illustrating a semiconductor apparatus according to an exemplary embodiment of the present inventive concept.

Referring to FIG. 1, a semiconductor apparatus 10 according to an exemplary embodiment of the present inventive concept may include a memory cell array 20, a driving circuit 30, a read/write circuit 40, and a control circuit 50.

The memory cell array 20 may include a plurality of memory cells, and the plurality of memory cells may be arranged in rows and columns. The plurality of memory cells included in the memory cell array 20 may be connected to the driving circuit 30 through a word line WL, a common source line CSL, a string select line SSL, a ground select line GSL, and the like, and may be connected to the read/write circuit 40 through a bit line BL. In an exemplary embodiment of the present inventive concept, a plurality of memory cells arranged in the same row may be connected to the same word line WL, and a plurality of memory cells arranged in the same column may be connected to the same bit line BL.

The plurality of memory cells included in the memory cell array 20 may be divided into a plurality of memory blocks. Each of the memory blocks may include a plurality of word lines WL a plurality of string select lines SSL, a plurality of ground select lines GSL, a plurality of bit BL, and at least one common source line CSL.

The driving circuit 30 and the read/write circuit 40 may be operated by the control circuit 50. In an exemplary embodiment of the present inventive concept, the driving circuit 30 may externally receive address information ADDR, decode the received address information ADDR, and select at least a portion of the word lines WL, common source lines CSL, string source lines SSL, and the ground select lines GSL connected to the memory cell array 20. The driving circuit 30 may include a driving circuit with respect to each of the word line WL, the string select line SSL, and the common source line CSL.

The read/write circuit 40 may select at least a portion of bit lines BL connected to the memory cell array 20 according to a command received from the control circuit 50. The read/write circuit 40 may read out data stored in a memory cell connected to the selected at least a portion of the bit lines BL or write data into the memory cell connected to the selected at least a portion of the bit lines BL. In order to perform the foregoing operation, the read/write circuit 40 may include circuits such as a page buffer, an input/output buffer, and a data latch.

The control circuit 50 may control operations of the driving circuit 30 and the read/write circuit 40 in response to an externally transmitted control signal CTRL. In a case in which data stored in the memory cell array 20 is read, the control circuit 50 may control an operation of the driving circuit 30 to supply a voltage for a read operation to a word line storing data desired to be read. When the voltage for a read operation is supplied to a specific word line WL, the control circuit 50 may control the read/write circuit 40 to read out data stored in a memory cell connected to the word line WL to which the voltage for a read operation has been supplied.

Meanwhile, in a case in which data to the memory cell array 20 is written, the control circuit 50 may control the low decoder 30 to supply a voltage for a write operation to a word line into which data is desired to be written. When the voltage for a write operation is supplied to a specific word line WL, the control circuit 50 may control the read/write circuit 40 to write data into a memory cell connected to the word line WL to which the voltage for a write operation has been applied.

Figure 2:
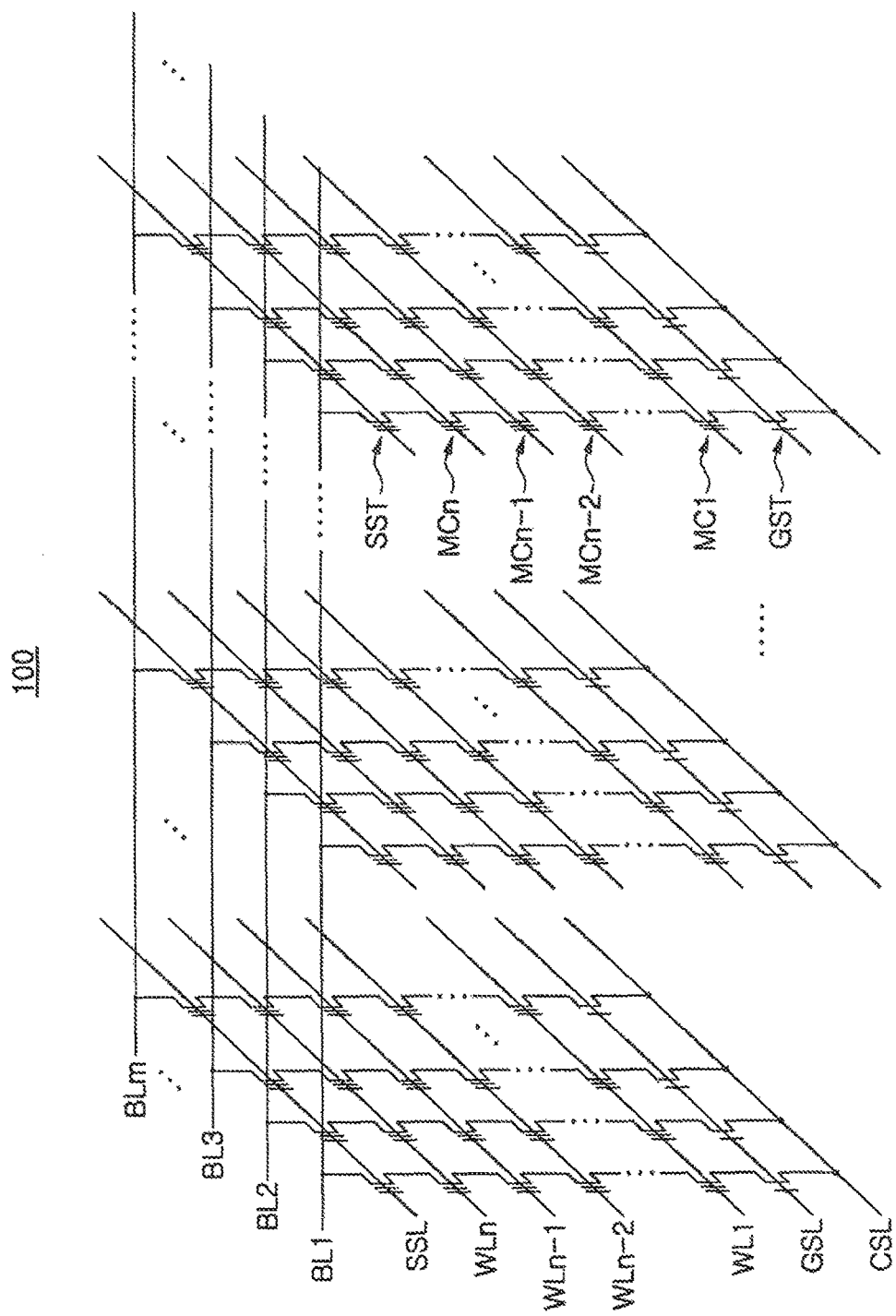
FIG. 2 is an equivalent circuit diagram illustrating a memory cell array of a semiconductor apparatus according to an exemplary embodiment of the present inventive concept.

FIG. 2 is an equivalent circuit diagram illustrating a memory cell array of a semiconductor apparatus according to an exemplary embodiment.

Specifically, FIG. 2 is an equivalent circuit diagram illustrating a three-dimensional (3D) structure of a memory cell array included in a vertical semiconductor apparatus 100. Referring to FIG. 2, the memory cell array according to the present exemplary embodiment may include a plurality of memory cell strings each including n number of memory cell elements MC1 to MCn connected in series, and a ground select transistor GST and a string select transistor SST connected to both ends of the memory cell elements MC1 to MCn.

The n number of memory cell elements MC1 to MCn connected in series may be connected to word lines WL1 to WLn for selecting at least a portion of the memory cell elements MC1 to MCn, respectively.

A gate terminal of the ground select transistor GST may be connected to the ground select line GSL, and a source terminal thereof may be connected to the common source line CSL. A gate terminal of the string select transistor SST may be connected to the string select line SSL, and a source terminal thereof may be connected to a drain terminal of the memory cell MCn. In FIG. 2, a structure in which the single ground select transistor GST and the single string, select transistor SST are connected to the n number of memory cell elements MC1 to MCn connected in series is illustrated, but alternatively, a plurality of ground select transistors GST and a plurality of string select transistors SST may be connected to the n number of memory cell elements MC1 to MCn.

A drain terminal of the string select transistor SST may be connected to the plurality of bit lines BL1 to BLm. When a signal is applied to the gate terminal of the string select transistor SST through the string select line SSL, a signal applied through the bit lines BL1 to BLm may be transferred to the n number of memory cell elements MC1 to MCn connected in series, to thereby perform a data read or write operation. Also, by applying a signal to the gate terminal of the ground select transistor GST having a source terminal connected to the common source line CSL through the gate select line GSL, an erase operation to remove all electric charges stored in the n number of memory cell elements MC1 to MCn may be executed.

Figure 3:
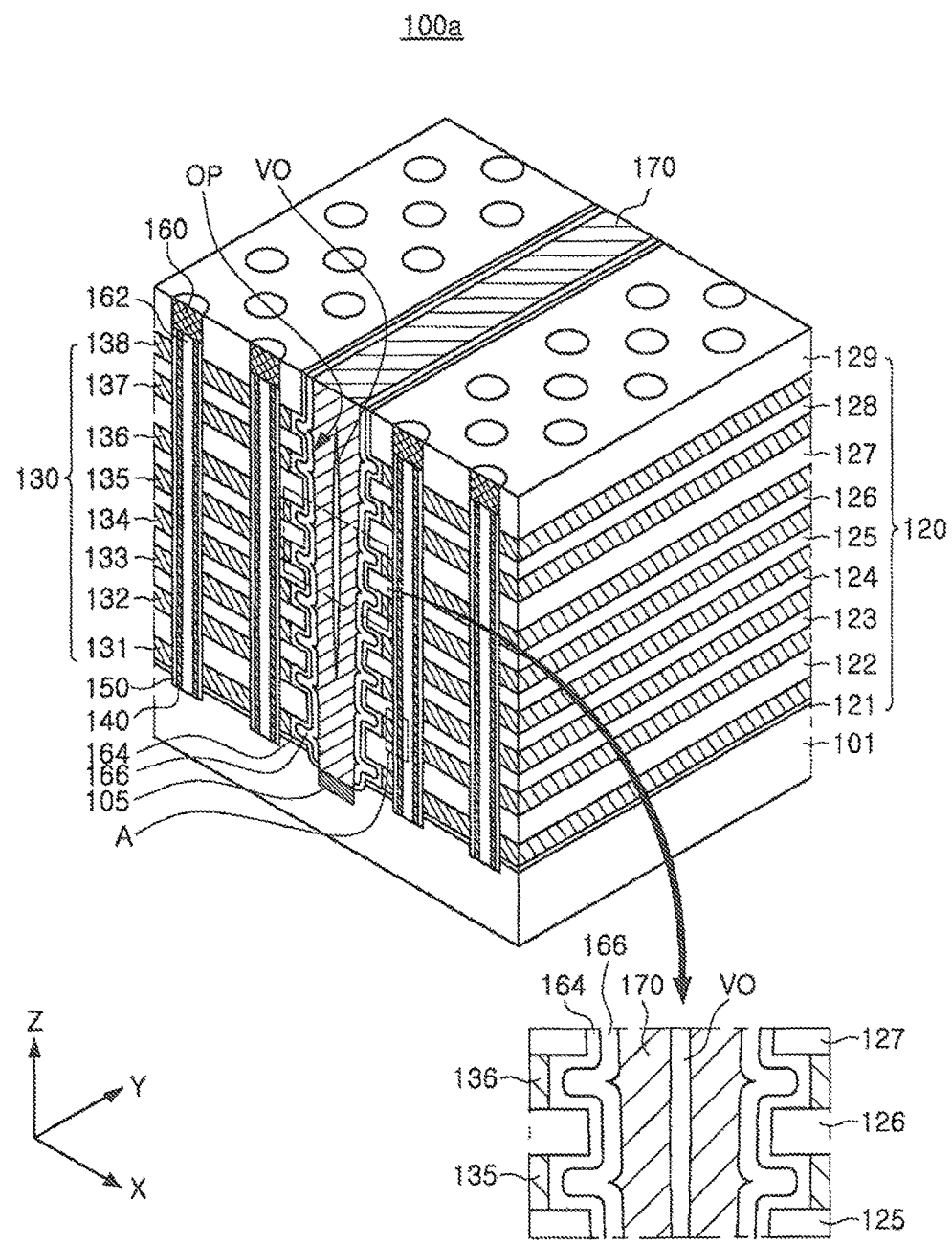
FIG. 3 is a perspective view illustrating a structure of memory cell strings of a semiconductor apparatus according to an exemplary embodiment of the present inventive concept.

FIG. 3 is a perspective view illustrating a structure of memory cell strings of a semiconductor apparatus according to an exemplary embodiment of the present inventive concept.

Referring to FIG. 3, a semiconductor apparatus 100a may include a substrate 101, a plurality of channel regions 140 disposed in a direction perpendicular to an upper surface of the substrate 101, and a plurality of interlayer insulating layers 120 and a plurality of gate electrodes 130 stacked alone outer side walls of the channel regions 140. The semiconductor apparatus 100a may further include a gate dielectric layer 150 disposed between the channel regions 140 and the gate electrodes 130, channel pads 150 in upper portions of the channel regions 140, an impurity region 105, and a conductive layer 170, having a void VO therein, disposed on the impurity region 105. A barrier layer 166 and a spacer layer 164 may be sequentially disposed on an outer side wall of the conductive layer 170. In FIG. 3, an upper line structure, for example, components such as the bit lines BL1 to BLm (refer to FIG. 2) are omitted. In the semiconductor apparatus 100a, a single memory cell string may be formed with respect to each channel region 140, and a plurality of memory cell strings may be arranged in rows and columns in x and y directions.

The substrate 101 may have an upper surface extending in the x and y directions. The substrate 101 may include a semiconductor material, for example, but not limited to, a Group IV semiconductor, a Group III-V compound semiconductor, or a Group II-VI oxide semiconductor. For example, a Group IV semiconductor may include silicon, germanium, or silicon-germanium. The substrate 101 may be provided as a bulk wafer or an epitaxial layer.

The columnar channel regions 140 may be disposed to extend in a direction (z direction) perpendicular to the upper surface of the substrate 101. The channel regions 140 may have an annular shape surrounding an internal channel insulating layer 162 therein, but according to exemplary embodiments, the channel regions 140 may have a columnar shape such as a cylindrical shape or a prismatic shape without the channel insulating layer 162. Also, the channel regions 140 may have a sloped side surface becoming narrower toward the substrate 101, according to an aspect ratio.

The channel regions are spaced apart from one another in the x direction and y direction, and may be disposed to be shifted in one direction. For example, the channel regions 140 may be disposed to form a grid or may be disposed in a zigzag manner in one direction. However, without being limited thereto, the channel regions 140 may be disposed variously according to exemplary embodiments. Some of the channel regions 140 may be dummy channels. In the present disclosure, the term "dummy" is used to designate a component present merely as a pattern having a structure the same as or similar to other components but not substantially functioning in the semiconductor apparatus 100a. Thus, an electrical signal is not applied to a "dummy" component, and even though an electrical signal is applied to the "dummy" component, the "dummy" component does not electrically perform the same function.

The channel regions 140 may be connected to the substrate 101 in a lower surface thereof. The channel regions 140 may include a semiconductor material such as polycrystalline silicon or single crystalline silicon, and the semiconductor material may be an undoped material or may be a material inducing a p-type or n-type impurity.

A plurality of gate electrodes 131 to 138 (130) may be disposed to be spaced apart from one another in the z direction along the side surfaces of the channel regions 140 from the substrate 101. Referring to FIG. 2 together, each of the gate electrodes 130 may form a gate of each of a ground select transistor GST, a plurality of memory cells MC1 to MCn, and a string select transistor SST. The gate electrodes 130 may extend to form the word lines WL1 to WLn, and may be commonly connected in a predetermined unit of adjacent memory strings arranged in the x and y directions in an exemplary embodiment, five gate electrodes 132 to 136 of the memory cells MC1 to MCn are arranged, but the present disclosure is not limited thereto, and the number of the gate electrodes 130 constituting the memory cells MC1 to MCn may be determined depending on capacity of the semiconductor apparatus 100. For example, the number of gate electrodes 130 constituting the memory cells MC1 to MCn may be $2^n$ (where n is a natural number).

The gate electrode 131 of the ground select transistor GST may extend in the y direction to form a ground select line GSL. For a function of the ground select transistor GST, a predetermined impurity may also be doped in the substrate 101 below the gate electrode 131.

The gate electrodes 137 and 138 of the string select transistor SST may extend in the y direction to form the string select line SSL. The gate electrodes 137 and 138 disposed to be aligned in the x direction may be connected to different bit lines BL1 to BLm (refer to FIG. 2) through an arrangement of a wiring structure. In an exemplary embodiment, the gate electrodes 137 and 138 of the string select transistor SST may be separated between the memory cell strings adjacent in the x direction to form different string select lines SSL. According to an exemplary embodiment, the string select transistor SST may have one or two or more gate electrodes 137 and 138 and the ground select transistor GST may have one or two or more gate electrodes 131, and these gate electrodes may have a structure the same or different from that of the gate electrodes 132 to 136 of the memory cells MC1 to MCn.

Also, a portion of gate electrodes 130, for example, gate electrodes 130 adjacent to the gate electrode 131 of the ground select transistor GST or the gate electrodes 137 and 138 of the string select transistor SST may be dummy gate electrodes. For example, the gate electrode 132 adjacent to the gate electrode 131 of the ground select transistor GST may be a dummy gate electrode.

The gate electrodes 130 may include polycrystalline silicon or metal silicide material. The metal silicide material may be silicide material of a metal selected from among cobalt (Co), nickel (Ni), hafnium (Hf), platinum (Pt), tungsten (W), and titanium (Ti), or any combination thereof. According to an exemplary embodiment, the gate electrodes 130 may include a metal, for example, tungsten (W). Also, although not shown, the gate electrodes 130 may further include a diffusion barrier, and the diffusion barrier may include, for example, a tungsten nitride (WN), tantalum nitride (TaN), and titanium nitride (TiN), or any combination thereof.

A plurality of interlayer insulating layers 121 to 129 (120) may be arranged between the gate electrodes 130. Like the gate electrodes 130, the plurality of interlayer insulating layers 120 may be arranged to be spaced apart from one another in the z direction and extend in the y direction. The interlayer insulating layers 120 may include an insulating material such as silicon oxide or silicon nitride.

The gate dielectric layer 150 may be disposed between the gate electrodes 130 and the channel regions 140. The gate dielectric layer 150 may extend vertically along the channel regions 140. The gate dielectric layer 150 may include a tunneling layer, an electric charge storage layer, and a blocking layer sequentially stacked on the channel regions 140. This will be described in detail with reference to FIGS. 4A through 4C.

In an upper end of the memory cell string, the channel pad 160 may be disposed to cover an upper surface of the channel insulating layer 162 and to be electrically connected to the channel region 140. The channel pad 160 may include, for example, doped polycrystalline silicon. The channel pad 160 may act as a drain region of the string select transistor SST (refer to FIG. 2).

The conductive layer 170 may be connected to the substrate 101 by penetrating through the gate electrodes 130 and the interlayer insulating layers 120 between the channel regions 140. The conductive layer 170 may be disposed in a linear shape extending in the y direction. One conductive layer 170 may be arranged for every two to four columns of the channel regions 140 at a predetermined distance in the x direction, but the configuration of the conductive layer 170 is not limited thereto. Due to a high aspect ratio, the conductive layer 170 may have a width decreased in a direction toward the substrate 101, but the shape of the conductive layer 170 is not limited thereto. Within an opening OP in the form of a trench connected to the substrate 101 by penetrating through the gate electrodes 130 and the interlayer insulating layers 120, the conductive layer 170 may be disposed to fill the opening OP. The conductive layer 170 may extend from the interlayer insulating layer 129 present in the uppermost portion, among the plurality of interlayer insulating layers 120 to the substrate 101.

The conductive layer 170 may form the common source line CSL of FIG. 2 and may include a metal such as tungsten (W), aluminum (Al), or copper (Cu). The conductive layer 170 may have the void VO therein. When the opening OP has a shape in which a width thereof decreases in a direction toward the substrate 101 due to a high aspect ratio, the void VO may be formed during a process of forming the conductive layer 170. Here, an acidic gas may be present within the void VO. The acidic gas may be generated by reacting an element forming a source material of the conductive layer 170 (for example, fluorine when a source material of the conductive layer 170 is tungsten hexafluoride ($WF_6$)) to a hydrogen gas when the conductive layer 170 is formed through chemical vapor deposition (CVD) or atomic layer deposition (ALD). The acidic gas confined in the void VO may be outgassed in a follow-up process. The barrier layer 166 disposed on the outer side wall of the conductive layer 170 may prevent introduction of the acidic gas outgassed from the void VO to the gate electrodes 130 or the channel regions 140.

The barrier layer 166 may be in direct contact with the conductive layer 170, but the configuration is not limited thereto. Also, the barrier layer 166 may be disposed on at least one surface of the spacer layer 164 disposed on the outer side wall of the conductive layer 170.

The barrier layer 166 may have an etch selectivity different from that of the spacer layer 164. For example, in a case in which etching is performed using the same etchant, the etch rate of the barrier layer 166 may be less than that of the spacer layer 164.

The barrier layer 166 may be formed of a of a material different from that of the spacer layer 164, and, may be formed of a material whose rate of acidification is less than that of the material forming the spacer layer 164 when the barrier layer 166 and the spacer layer 164 come into contact with the outgassed acidic gas. Thus, in a case in which the barrier layer 166 and the spacer layer 164 are sequentially disposed on the outer side wall of the conductive layer 170, even though the acidic gas outgassed from the void VO comes into direct contact with the barrier layer 166, the barrier layer 166 is not acidified to be dissolved, whereby the acidic gas is prevented from coming into direct contact, with the spacer layer 164. Thus, even though the spacer layer 164 is formed of a material without tolerance to an acidic gas, the spacer layer 164 may not be damaged by the acidic gas, and thus, short circuits between the gate electrodes 130 and the conductive layer 170 may be prevented. Also, short circuit between the gate electrodes 130 may be prevented.

The barrier layer 166 may have class A or class AA when acid resistance thereof is measured by ASTM (American Society for Testing and Materials) C 282. The barrier layer 166 having class A or class AA may effectively block an acidic gas, for example, hydrofluoric acid.

At least one of the barrier layer 166 and the spacer layer 164 may be formed of an insulating material, and the conductive layer 170 and the gate electrodes 130 may be insulated from each other.

The barrier layer 166 may be a nitride or an oxynitride. For example, the barrier layer 166 may be a silicon nitride or a silicon oxynitride (SiON).

The spacer layer 164 may be formed of an insulating material, such as silicon dioxide ($SiO_2$).

Side surfaces of the interlayer insulating layers 120 in contact with the spacer layer 164 may further protrude more than the side surfaces of the gate electrodes 130 in contact with the spacer layer 164. The spacer layer 164 and the barrier layer 166 sequentially stacked on the protruded side surfaces may have an uneven portion or pattern, and an uneven portion or pattern may also be formed on the outer side wall of the conductive layer 170 filling the opening OP. For example, the uneven portion or pattern may comprise a seam formed on the outer side wall of the conductive layer 170 opposite the gate electrodes.

The impurity region 105 may be disposed below a lower portion of the conductive layer 170 within the substrate 101. The impurity region 155 may be adjacent to the upper surface of the substrate 101 and extend in the y direction. The impurity region 105 may include an impurity having a conductivity type the same as or opposite to that of the substrate 101. In a case in which the impurity region 105 includes the same type of impurity, the impurity may be included in a concentration higher than that of the substrate 101. The conductive layer 170 may apply a voltage to the substrate 101 through the impurity region 105.

Figure 4A:
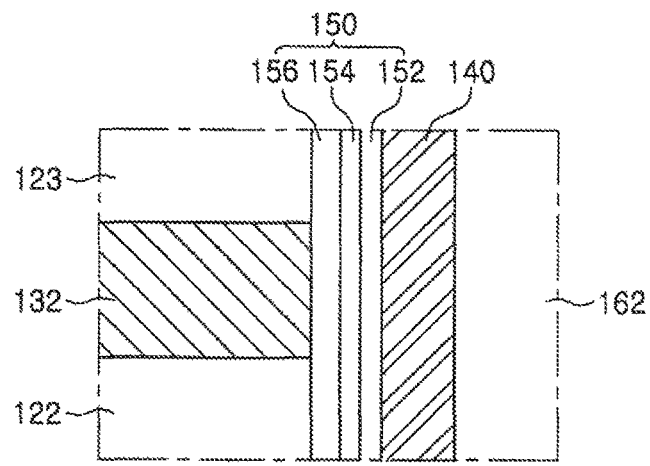
FIGS. 4A through 4C are cross-sectional views illustrating a gate dielectric layer according an exemplary embodiment of the present inventive concept, in which a region corresponding to a region "A" of FIG. 3 is illustrated.
Figure 4B:
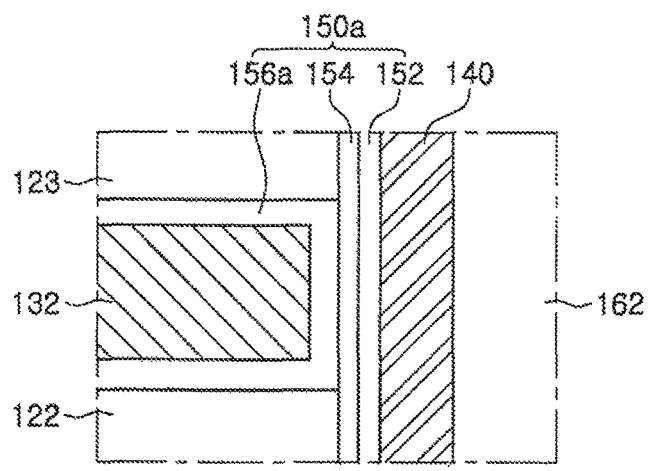
Figure 4C:
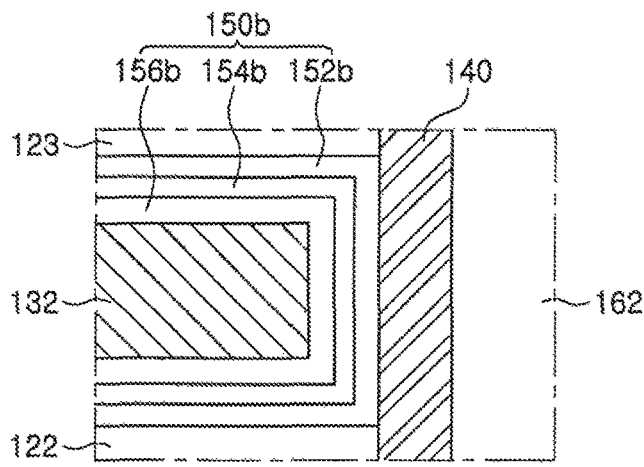

FIGS. 4A through 4C are cross-sectional views illustrating a gate dielectric layer according exemplary embodiments of the present inventive concept, in which a region corresponding to a region 'A' of FIG. 3 is illustrated.

Referring to FIG. 4A, the gate electrode 132, the gate dielectric layer 150, and the channel region 140 of the memory cell strings are illustrated. The gate dielectric layer 150 may include a tunneling layer 152, an electric charge storage layer 154, and a blocking layer 156 sequentially stacked on the channel region 140.

The tunneling layer 152 may tunnel electric charges to the electric charge storage layer 154 in a Fowler-Nordheim (F-N) manner. The tunneling layer 152 may include a silicon dioxide ($SiO_2$), a silicon nitride ($Si_3N_4$), a silicon oxynitride (SiON), car any combination thereof.

The electric charge storage layer 154 may be an electric charge trap layer or a floating gate conductive layer. For example, the electric charge storage layer 154 may include a dielectric material, quantum dots, or nanocrystals. Here, the quantum dots or the nanocrystals may be formed of fine panicles of a conductor, such as a metal or a semiconductor. In an exemplary embodiment, when the electric charge storage layer 154 is an electric charge trap layer, the electric charge storage layer 154 may be formed of a silicon nitride.

The blocking layer 156 may include a silicon dioxide ($SiO_2$), a silicon nitride ($Si_3N_4$), a silicon oxynitride (SiON), a high-k dielectric material, or any combination thereof. The high-k dielectric material may be any one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lantana oxide ($La_2O_3$), a lantana aluminum oxide ($LaAl_xO_y$), a lantana hafnium oxide ($LaHf_xO_y$), a hafnium aluminum oxide ($HfAl_xO_y$), and a praseodymium oxide ($Pr_2O_3$).

Referring to FIG. 4B, the gate electrode 132, a gate dielectric layer 150a and the channel region 140 of memory cell strings are illustrated. The gate dielectric layer 150a may have a structure in which a tunneling layer 152, an electric charge storage layer 154, and a blocking layer 156a are sequentially stacked on tae channel region 140. Relative thicknesses of the layers forming the gate dielectric layer 150a are not limited to those illustrated in the drawing and may be variously changed.

In particular, unlike the exemplary embodiment of FIG. 4A, in the gate dielectric layer 150a, the tunneling layer 152 and the electric charge storage layer 154 are disposed to extend perpendicularly in relation to the substrate 101 along the channel region 140, but the blocking layer 156a may be disposed to surround the gate electrode layer 132.

Referring to FIG. 4C, a gate electrode 132, a gate dielectric layer 150b, and a channel region 140 of memory cell strings are illustrated. The gate dielectric layer 150b may have a structure in a tunneling layer 152b, an electric charge storage layer 154b, and a blocking layer 156b are sequentially stacked on the channel region 140.

In particular, unlike the exemplary embodiments of FIGS. 4A and 4B, in the gate dielectric layer 150b, all the tunneling layer 152b, the electric charge storage layer 154b, and the blocking layer 156b may be disposed to surround the gate electrode layer 132. In some exemplary embodiments, a portion of the blocking layer 156b may be disposed to extend perpendicularly in relation to the substrate 101 along the channel region 140, while another portion of the blocking layer 156b may be disposed to surround the gate electrode layer 132.

FIGS. 5 through 8 are cross-sectional views schematically illustrating a semiconductor apparatus according an exemplary embodiment of the present inventive concept.

Figure 5:
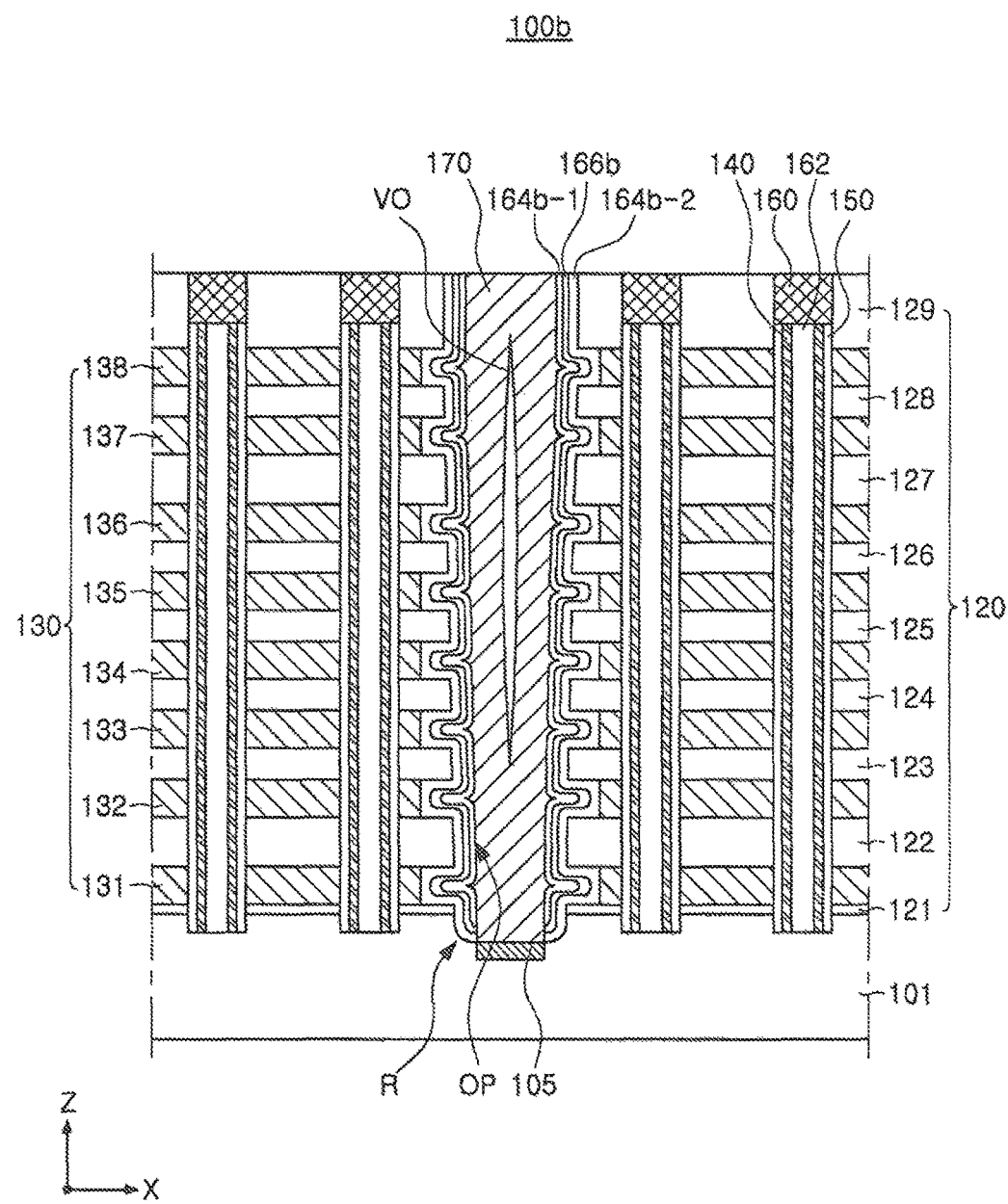
FIGS. 5 through 8 are cross-sectional views schematically illustrating a semiconductor apparatus according an exemplary embodiment of the present inventive concept.

Referring to FIG. 5, a semiconductor apparatus 100b may include a substrate 101, a plurality of channel regions 140, a plurality of interlayer insulating layers 120, a plurality of gate electrodes 130, a plurality of gate dielectric layers 150, a plurality of channel pads 160, an impurity region 105, a conductive layer 170, first and second spacer layers 164b-1 and 164b-2, and a barrier layer 166.

In the present exemplary embodiment, the first spacer layer 164b-1 the barrier layer 166b, and the second spacer layer 164b-2 may be sequentially disposed on the conductive layer 170, but the disposition is not limited thereto. For example, a plurality of spacer layers may further be sequentially disposed on the second spacer layer 164b-2.

The recess R may be formed in the substrate 101 in contact with a lower portion of the conductive layer 170 so that the lower portion of the conductive layer 170 is in direct contact with the impurity region 105.

The barrier layer 166b may be formed of a material different from those of the first and second spacer layers 164b-1 and 164b-2, and may be formed of a material whose rate of acidification is less than that of the material forming the first and second spacer layers 164b-1 and 164b-2 when the barrier layer 166b and the first and second spacer layers 164b-1 and 164b-2 come into contact with the outgassed acidic gas. Thus, when the acidic gas outgassed from the void VO comes into direct contact with the barrier layer 166b, the barrier layer 166b is not acidified to be dissolved, whereby the acidic gas is prevented from coming into direct contact with the second spacer layer 164b-2. Thus, even though the second spacer layer 164b-2 is formed of a material without tolerance to an acidic gas, the spacer layer 164b-2 may not be damaged by the acidic gas, and thus, short circuits between the gate electrodes 130 and the conductive layer 170 may be prevented. Also, since the plurality of interlayer insulating layers 120 are not dissolved by the acidic gas, short circuits between the gate electrodes 130 may be prevented.

The barrier layer 166b may be formed of the same material as that of the barrier layer 166 described with reference to FIG. 3, and the first and second spacer layers 164b-1 and 164b-2 may be formed of the same material as that of the spacer layer 164 described with reference to FIG. 3.

Figure 6:
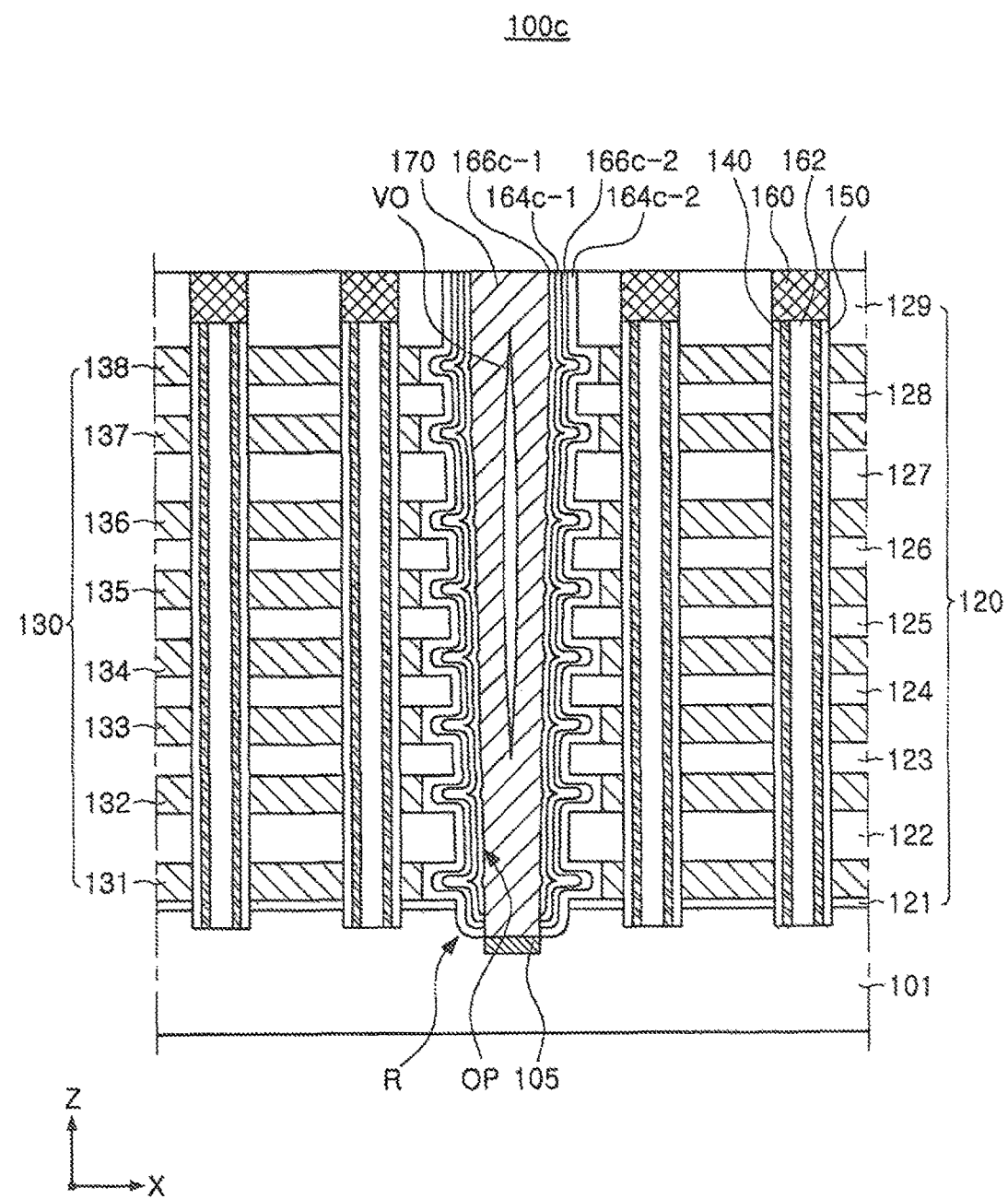

Referring to FIG. 6, a semiconductor apparatus 100c may include a substrate 101, a plurality of channel regions 140, a plurality of interlayer insulating layers 120, a plurality of gate electrodes 130, a plurality of gate dielectric layers 150, a plurality of channel pads 160, an impurity region 105, a conductive layer 170, first and second barrier layers 166c-1 and 166c-2, and first and second spacer layers 164c-1 and 164c-2.

In the present exemplary embodiment, the first barrier layer 166c-1, the first spacer layer 164c-1, the second barrier layer 166c-2, and the second spacer layer 164c-2 may be sequentially disposed on the conductive layer 170. In FIG. 6, it is illustrated that the barrier layers 166c-1 and 166c-2 and the spacer layers 164c-1 and 164c-2 are alternately disposed twice, but the disposition thereof is not limited thereto. For example, the barrier layers 166c-1 and 166c-2 and the spacer layers 164c-1 and 164c-2 may be alternately disposed three or more times.

The barrier layers 166c-1 and 166c-2 may be formed of a material different from those of the spacer layers 164c-1 and 164c-2, and may be formed of a material whose rate of acidification is less than that of the material forming the spacer layers 164c-1 and 164c-2 when the barrier layers 166c-1 and 166c-2 and the spacer layers 164c-1 and 164c-2 come into contact with the outgassed acidic gas. Thus, when the acidic gas outgassed from the void VO comes into direct contact with the first barrier layer 166c-1, the first barrier layer 166c-1 is not acidified to be dissolved, whereby the acidic gas is prevented from coming into direct contact with the first spacer layer 164c-1, the second barrier layer 166c-2, and the second spacer layer 164c-2. In a case in which the first barrier layer 166c-1 fails to block all of the acidic gas, the acidic gas may be blocked by the second barrier layer 166c-2. Thus, even the second spacer layer 164c-2 is formed of a material without tolerance to an acidic gas, the acidic gas is prevented from coming into direct contact with the spacer layer 164c-2 by the second barrier layer 166c-2, and short circuits between the gate electrodes 130 and the conductive layer 170 may be prevented. Also, short circuits between the gate electrodes 130 may be prevented.

The barrier layers 166c-1 and 166c-2 may be formed of the barrier layer 166 described with reference to FIG. 3, and the spacer layers 164c-1 and 164c-2 may be formed of the same material as that of the spacer layer 164 described with reference to FIG. 3.

Figure 7:
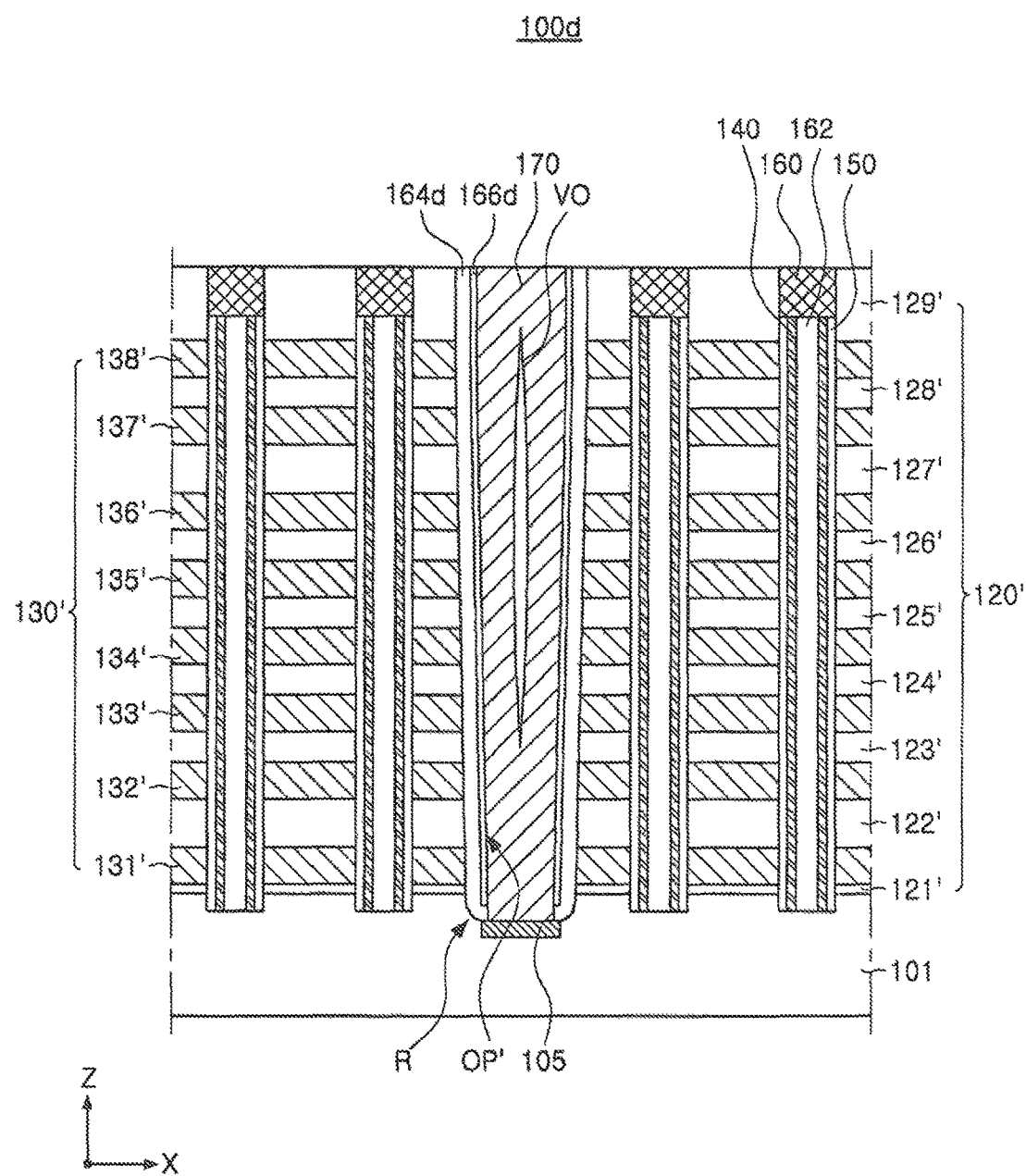

Referring to FIG. 7, a semiconductor apparatus 100d may include a substrate 101, a plurality of channel regions 140, a plurality of interlayer insulating layers 120', a plurality of gate electrodes 130', a plurality of gate dielectric layers 150, a plurality of channel pads 160, an impurity region 105, a conductive layer 170, a barrier layer 166d, and a spacer layer 164d.

The plurality of gate electrodes 131' to 138' (130') may be disposed to be spaced apart from one another on the substrate 101 along side surfaces of the channels 140. The gate electrodes 130' may be disposed in the same manner as that of the gate electrodes 130 illustrated in FIG. 3 and perform the same function. Also, the gate electrodes 130' may be formed of the same material as that of the gate electrodes 130 described with reference to FIG. 3.

The plurality of interlayer insulating layers 121' to 129' (120') may be arranged between the gate electrodes 130'. The interlayer insulating layers 120' may be disposed in the same manner as that of the interlayer insulating layers 120 illustrated in FIG. 3 and perform the same function. Also, the interlayer insulating layers 120' may be formed of the same material as that of the interlayer insulating layers 120 described with reference to FIG. 3.

Within an opening OP' in the form of a trench connected to the substrate 101 by penetrating through the gate electrodes 130' and the interlayer insulating layers 120', the conductive layer 170 may be disposed to cover side walls of the opening OP'.

The opening OP' may be formed by simultaneously removing the gate electrodes 130' and the interlayer insulating layers 120' and subsequently sequentially depositing the spacer layer 164d and the barrier layer 166d. For example, the opening OP' may be formed in the following manner and in following order: i) First, the gate electrodes 130' and the interlayer insulating layers 120' are alternately stacked on the substrate 101; ii) A mask layer opening positions from which the gate electrodes 130' and the interlayer insulating layers 120' are to be removed is formed on the gate electrodes 130' and the interlayer insulating layers 120'; iii) The gate electrodes 130' and the interlayer insulating layers 120' are anisotropically etched; and iv) the spacer layer 164d and the barrier layer 166d are sequentially deposited.

When the opening OP' is formed in this manner, the gate electrodes 130' in direct contact with the spacer layer 164d and the interlayer insulating layers 120' in direct contact with the spacer layer 164d may be substantially coplanar.

The opening OP' may be formed as a trench extending in the y direction (refer to FIG. 3). The opening OP' may expose the substrate 101 between the channel regions 140.

The barrier layer 168d may be formed of a material different from that of the spacer layer 164d, and may be formed of a material whose rate of acidification is less than that of the material forming the spacer layer 164d when the barrier layer 166d and the spacer layer 164d come into contact with the outgassed acidic gas. Thus, in a case in which the barrier layer 166d and the spacer layer 164d are sequentially disposed on the outer side wall of the conductive layer 170, even though the acidic gas outgassed from the void VO comes into direct contact with the barrier layer 166d, the barrier layer 166d is not acidified to be dissolved, whereby the acidic gas is prevented from corning into direct contact with the spacer layer 164d. Thus, even though the spacer layer 164d is formed of a material without tolerance to an acidic gas, the spacer layer 164d may not be damaged by the acidic gas. Since the spacer layer 164d is not damaged, even though the gate electrodes 130' are not recessed by forming the opening OP' in the manner applied to the present exemplary embodiment, short circuits between the gate electrodes 130' and the conductive layer 170 may be prevented. Also, short circuits between the gate electrodes 130' may be prevented.

When the barrier layer 166d effectively blocks a gas discharged from the void VO, the spacer layer 164d is not damaged, and thus, introduction of a metallic element forming the gate electrodes 130' to the spacer layer 164d may be prevented. Thus, the barrier layer 166d and the spacer layer 164d may not include a metallic element forming the gate electrodes 130'. In this case, short circuits between the gate electrodes 130' and the conductive layer 170 or short circuits between the gate electrodes 130' due to the metals may be prevented.

A thickness of the spacer layer 164*d* may be greater than that of the barrier layer 166*d*. In detail the thickness of the spacer layer 164*d* may be two to four times that of the barrier layer 166*d*. When the thickness of the spacer layer 164*d* is greater than the banner layer 166*d*, short circuits between the gate electrodes 130' and the conductive layer 170 and short circuits between the gate electrodes 130' may be more effectively prevented.

The barrier layer 166*d* and the spacer layer 164*d* may be formed of the same materials a as those of the barrier layer 166 and the spacer layer 164 described with reference to FIG. 3.

Figure 8:
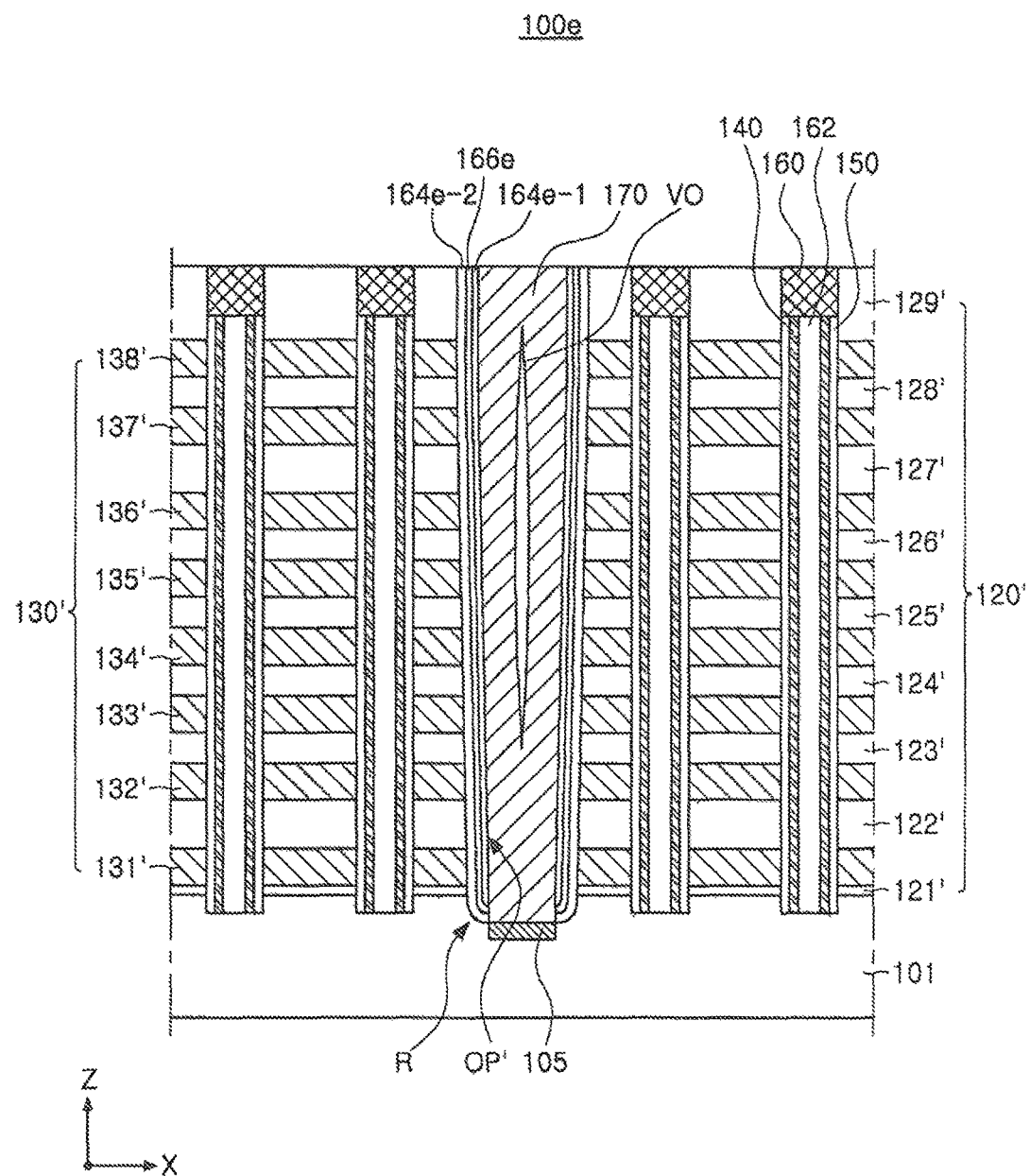

Referring to FIG. 8, a semiconductor apparatus 100*e* may include a substrate 101, a plurality of channel regions 140, a plurality of interlayer insulating layers 120', a plurality of gate electrodes 130', a plurality of gate dielectric layers 150, a plurality of channel pads 160, an impurity region 105, a conductive layer 170, a barrier layer 166*e*, and first and second spacer layers 164*e*-1 and 164*e*-2.

In the present exemplary embodiment, the first spacer layer 164*e*-1, the barrier layer 166*e*, and the second spacer layer 164*e*-2 may be sequentially disposed on the conductive layer 170, but the disposition thereof is not limited thereto. For example, a plurality of spacer layers may be further sequentially disposed on the second spacer layer 164*e*-2.

The barrier layer 166*e* may be formed of a material different from those of the first and second spacer layers 164*e*-1 and 164*e*-2, and may be formed of a material whose rate of acidification is less than that of the material forming the first and second spacer layers 164*e*-1 and 164*e*-2 when the barrier layer 166*e* and the first and second spacer layers 164*e*-1 and 164*e*-2 come into contact with the outgassed acidic gas. Thus, even though the acidic gas outgassed from the void VO comes into direct contact with the barrier layer 166*e*, the barrier layer 166*e* is not acidified to be dissolved, whereby the acidic gas is prevented from coming into direct contact with the second spacer layer 164*e*-2. Thus, even though the second spacer layer 164*e*-2 is formed of a material without tolerance to an acidic gas, the second spacer layer 164*e*-2 may not be damaged by the acidic gas. Thus, even though the gate electrodes 130' are not recessed compared with the interlayer insulating layers 120', short circuits between the gate electrodes 130' and the conductive layer 170 may be prevented. Also, short circuits between the gate electrodes 130' may be prevented.

A thickness of the second spacer layer 164*e*-2 may be greater than that of the barrier layer 166*e*. In detail, the thickness of the second spacer layer 164*e*-2 may be two to four times that of the barrier layer 166*e*.

The barrier layer 166*e* may be formed of the same material as that of the barrier layer 166 illustrated in FIG. 3, and the first and second spacer layers 164*e*-1 and 164*e*-2 may be formed of the same material as that of the spacer layer 164 described with reference to FIG. 3.

The components of the exemplary embodiments illustrated in FIGS. 7 and 8 are not limited to the foregoing exemplary embodiments and may be applied together with the components of the exemplary embodiments illustrated in FIGS. 3, 5, and 6 in a mixed manner.

FIGS. 9 through 17 are cross-sectional views illustrating major stages of a method for manufacturing a semiconductor apparatus according to exemplary embodiments of the present inventive concept. In FIGS. 9 through 17, regions corresponding to the x-z cross-section of the perspective view of FIG. 3 may be illustrated.

Figure 9:
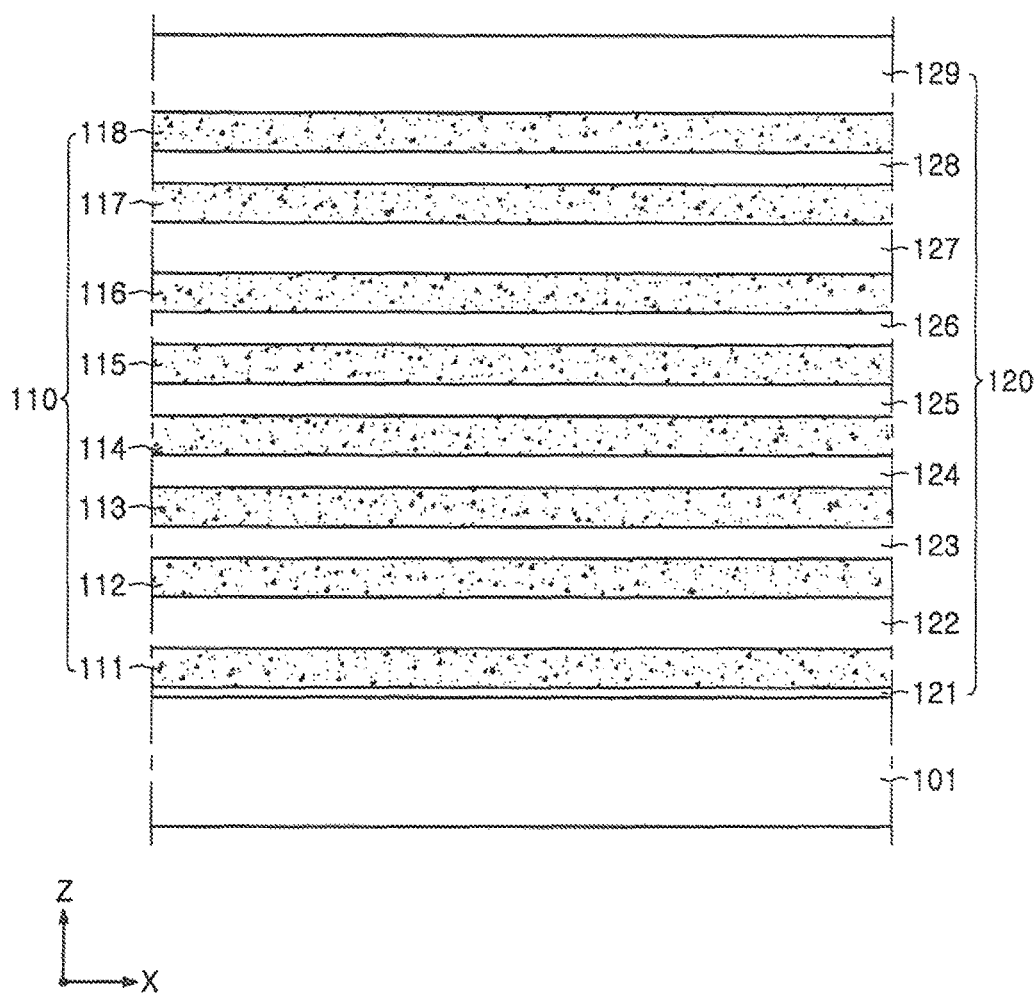
FIGS. 9 through 17 are cross-sectional views illustrating major stages of a method for manufacturing a semiconductor apparatus according an exemplary embodiment of the present inventive concept.

Referring to FIG. 9, as illustrated, sacrificial layers 111 to 118 (110) and interlayer insulating layers 121 to 129 (120), starting from a first interlayer insulating layer 121, may be alternately stacked on a substrate 101. The sacrificial layers 110 may be formed of a material that may be etched with etch selectivity with respect to the interlayer insulating layers 120. That is, the sacrificial layers 110 may be formed of a material that may be etched, while minimizing etching of the interlayer insulating layers 120 during a process of etching the sacrificial layers 110. The etch selectivity may be expressed quantitatively through a ratio of an etch rate of the sacrificial layers 110 to an etch rate of the interlayer insulating layers 120. For example, the interlayer insulating layers 120 may be formed of at least one of a silicon oxide and a silicon nitride, and the sacrificial layer 110 may be formed of a material different from that of the interlayer insulating layers 120 selected from among silicon, a silicon oxide, a silicon carbide, and a silicon nitride.

As illustrated, in the exemplary embodiment, thicknesses of the interlayer insulating layers 120 may not be uniform. The lowermost interlayer insulating layer 121, among the interlayer insulating layers 120, may be formed to be relatively thin, and the uppermost interlayer insulating layer 129 may be formed to be relatively thick. In the exemplary embodiment, the interlayer insulating layers 122 and 127 disposed between the ground select transistor GST and the string select transistor SST and the memory cells MC1 to MCn may be formed to be thicker than the interlayer insulating layers 123 to 126 disposed between the memory cells MC1 to MCn. Thicknesses of the interlayer insulating layers 120 and the sacrificial layers 110 may be variously modified from the illustrated thicknesses, and the number of films constituting the interlayer insulating layers 120 and the sacrificial layers 110 may be variously modified.

In an exemplary embodiment, a predetermined amount of impurity may be doped in the substrate 101 corresponding to a lower portion of a region in which the gate electrode 131 (refer to FIG. 3) is to be disposed, for an electrical operation between the impurity region 105 and the ground select transistor GST.

Figure 10:
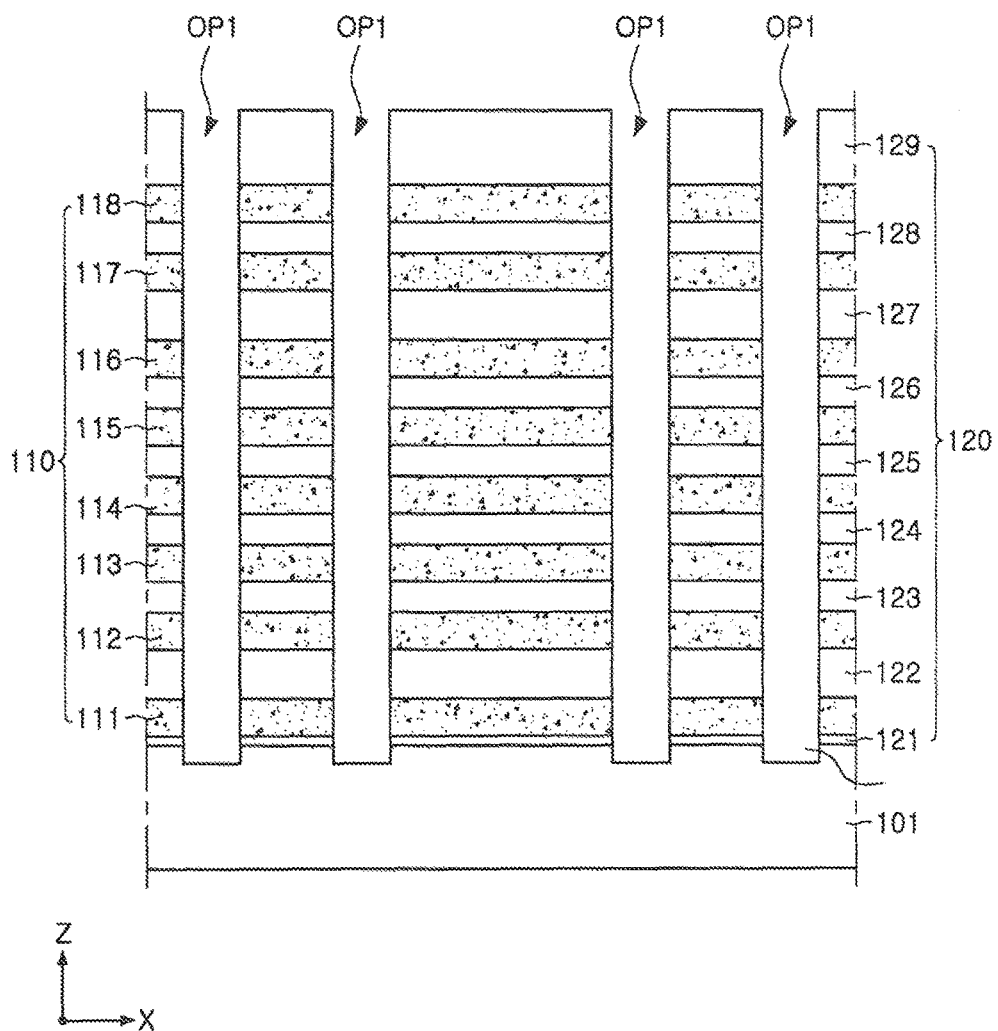

Referring to FIG. 10, first openings OP1 extending to the substrate 101 in a vertical direction may be formed. The first openings OP1 may be formed to correspond to regions in which the channel regions 140 described above with reference to FIG. 3 are disposed.

The first openings OP1 may be formed by anisotropy-etching the sacrificial layers 110 and the interlayer insulating layers 120. Since the stacked structure including two types of different films is etched, the side walls of the first openings OP1 may not be perpendicular to an upper surface of the substrate 101. For example, a width of the first openings OP1 may be decreased toward the upper surface of the substrate 101. Portions of the substrate 101 may be recessed by the first openings OP1.

In an exemplary embodiment, an epitaxial layer may be further formed on the recessed regions of the substrate 101. The epitaxial layer may be formed so that an upper surface thereof is higher than an upper surface of the sacrificial layer 111 replaced with the gate electrode 131 of the ground select transistor GST (refer to FIG. 2)

Figure 11:
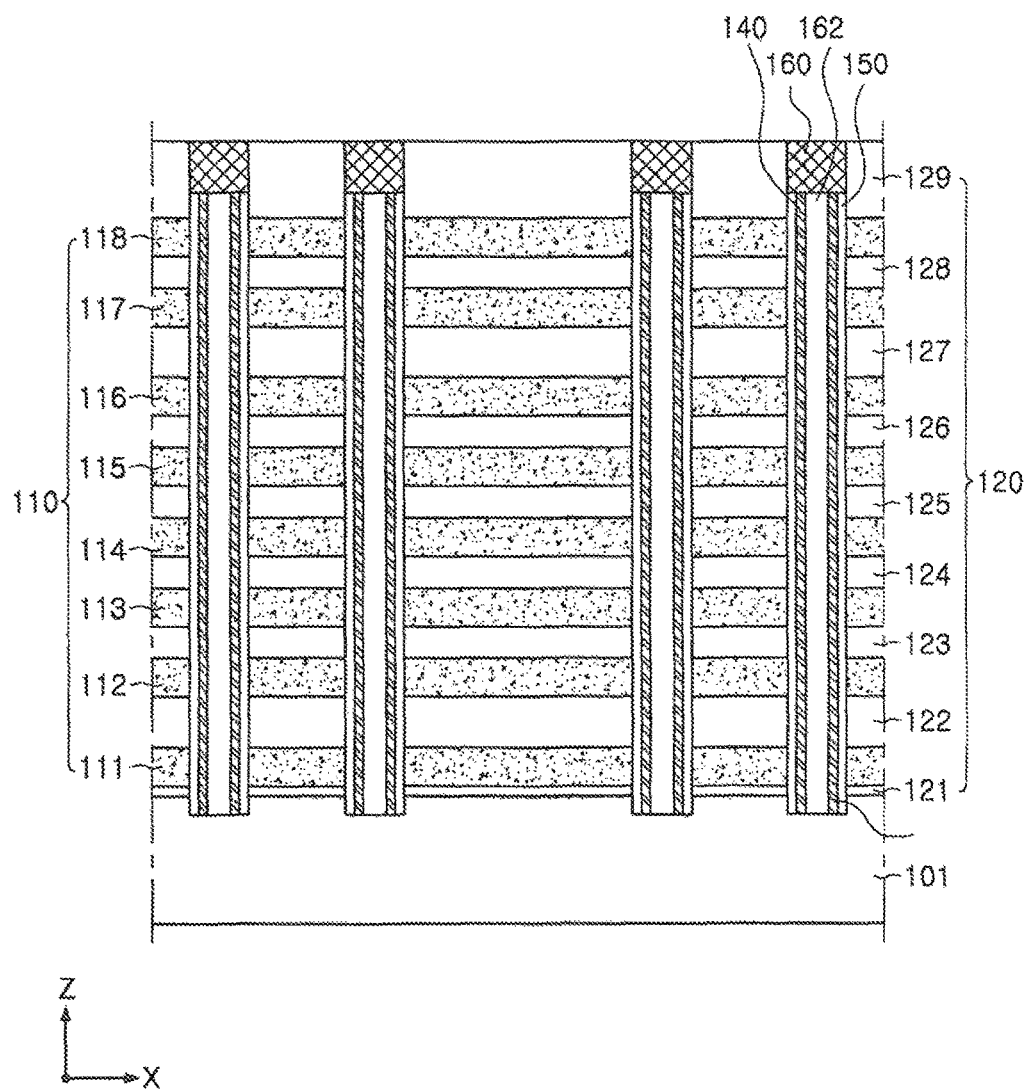

Referring to FIG. 11, a gate dielectric layer 150, a channel region 140, a channel insulating layer 162, and a channel pad 160 may be formed within the first openings OP1.

The gate dielectric layer 150 may be formed to have a uniform thickness through ALD or CVD. At this stage, the entirety or only a portion of the gate dielectric layer 150 may be formed, and as in the exemplary embodiments described above with reference to FIGS. 4A through 4C, a portion extending to be perpendicular to the substrate 101 along the channel region 140 may be formed at this stage.

In order to form the channel region 140 so that it is in direct contact with the substrate 101, a portion of the gate dielectric layer 150 formed on the upper surface of the substrate 101 may be removed within the first openings OP1.

The channel insulating layer 162 may be formed to fill the first openings OP1, and may be formed of an insulating material. However, in some exemplary embodiments, the channel region 140 may also be filled with a conductive material, rather than the channel insulating layer 162.

The channel pad 160 may be formed of a conductive material. The channel pad 160 may be electrically connected to the channel region 140.

Figure 12:
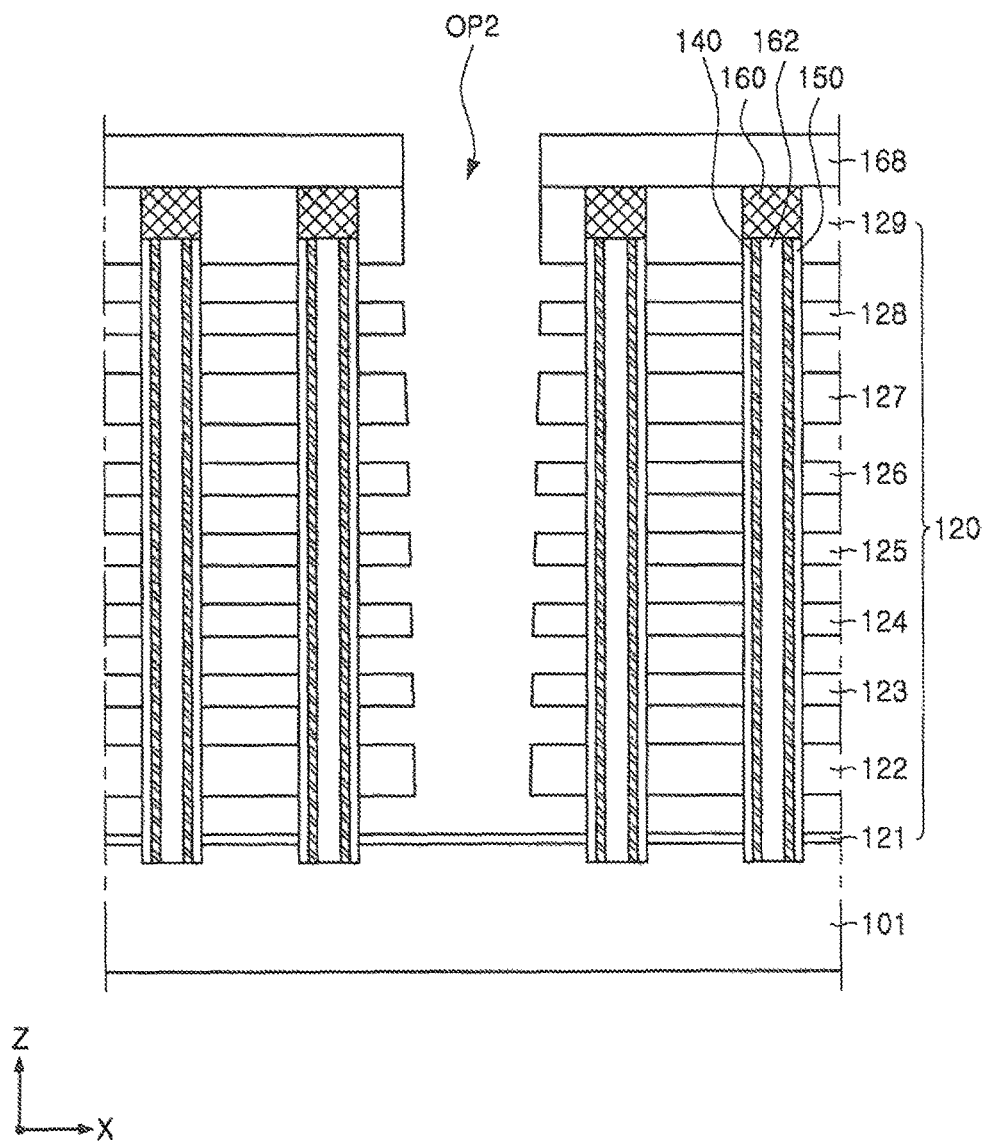

Referring to FIG. 12, a second opening OP2 separating the stacked structure of the sacrificial layers 110 and the interlayer insulating layers 120 at a predetermined distance is formed, and the sacrificial layers 110 exposed through the second opening OP2 may be removed.

Before the formation of the second opening OP2, an upper insulating layer 168 may be additionally formed on the uppermost interlayer insulating layer 129 and the channel pad 160 in order to prevent damage to the channel pad 160 and the channel region 140 therebelow.

The second opening OP2 may be formed by forming a mask layer using a photolithography process and anisotropy-etching the stacked structure of the sacrificial layers 110 and the interlayer insulating layers 120. The second opening OP2 may be formed as a trench extending in the y direction (refer to FIG. 3). The second opening OP2 may expose the substrate 101 between the channel regions 140. The sacrificial layers 110 may be removed through etching, and accordingly, a plurality of lateral openings may be formed between the interlayer insulating layers 120. Portions of side walls of the gate dielectric layers 150 may be exposed through the lateral openings.

Figure 13:
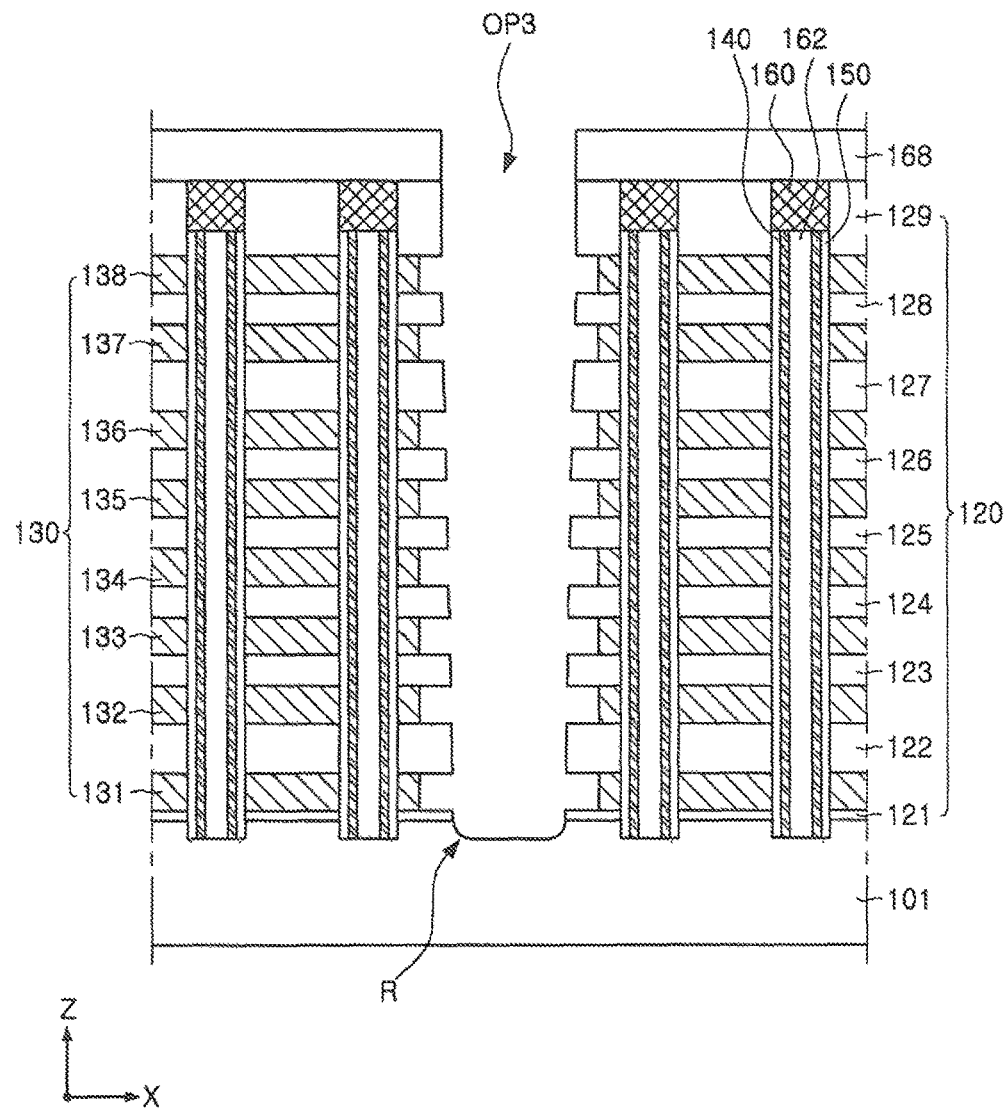

Referring to FIG. 13, the gate electrodes 130 are formed within the lateral openings from which the sacrificial layers 110 were removed, and a third opening OP3 may be formed.

The gate electrodes 130 may include a metal, polycrystalline silicon, or a metal silicide material. The metal silicide material may be a metal silicide material selected from among cobalt (Co), nickel (Ni), hafnium (Hf), platinum (Pt), tungsten (W), and titanium (Ti), or combinations thereof. In a case in which the gate electrodes 130 are formed of the metal silicide material, the gate electrodes 130 may be formed by filling the lateral openings with silicon (Si), forming a separate metal layer, and subsequently performing a silicidation.

After the formation of the gate electrodes 130, the third opening OP3 may be formed by removing the material forming the gate electrodes 130 formed within the second opening OP2 through an additional process so that the gate electrodes 130 may be disposed only within the lateral openings. Here, a recess R may be formed as portions of the interlayer insulating layer 121 and the substrate 101 are removed within the third opening OP3. At this stage, as illustrated, the interlayer insulating layers 120 may protrude toward the third opening OP3, relative to the gate electrodes 130, but the configuration is not limit d thereto.

Figure 14:
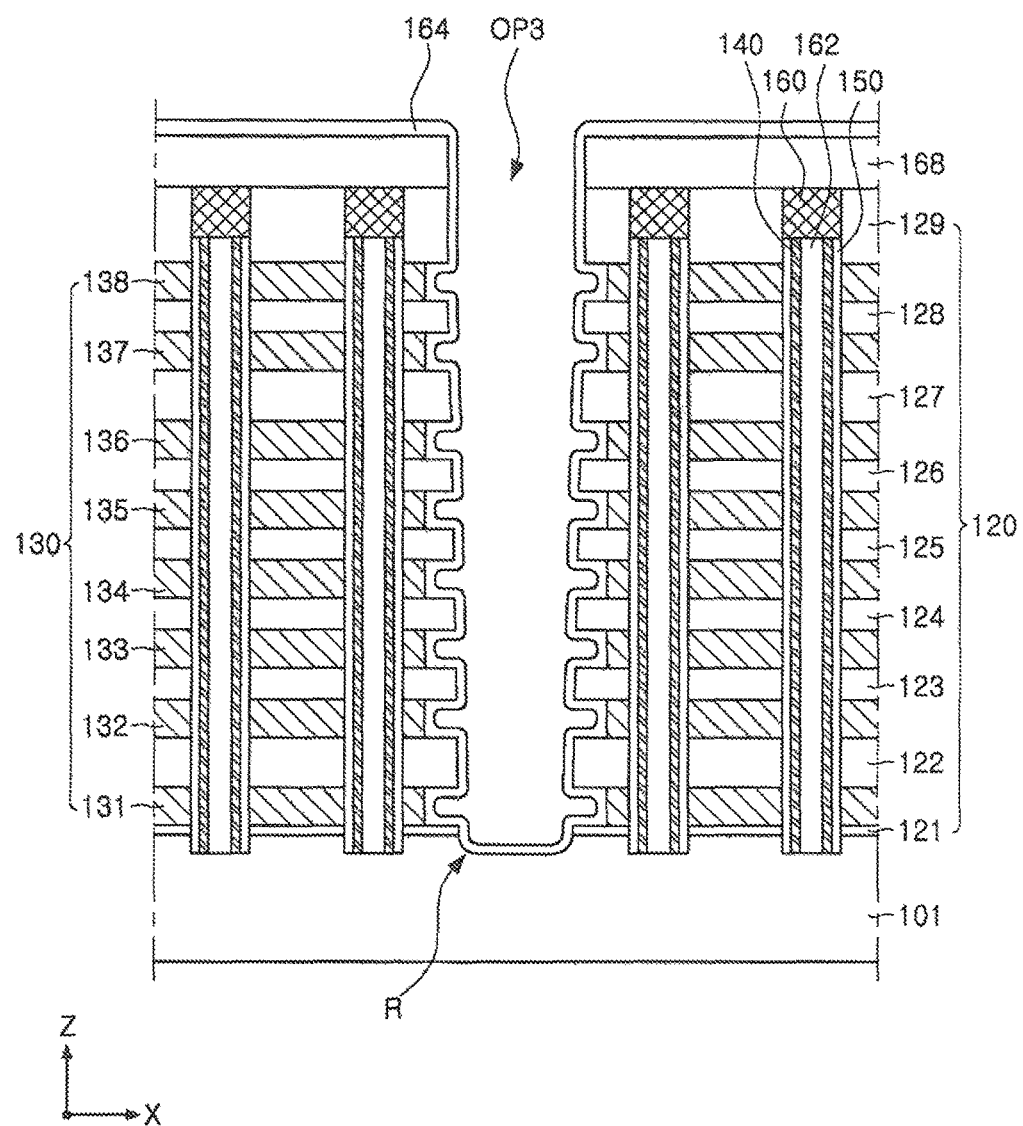

Referring to FIG. 14, a spacer layer 164 may be formed to cover a side wall of the third opening OP3, an upper surface of the recess R, and an upper surface of the upper insulating layer 168. Since the spacer layer 164 is stacked along the shape of the side wall of the third opening OP3, it may be uneven.

Figure 15:
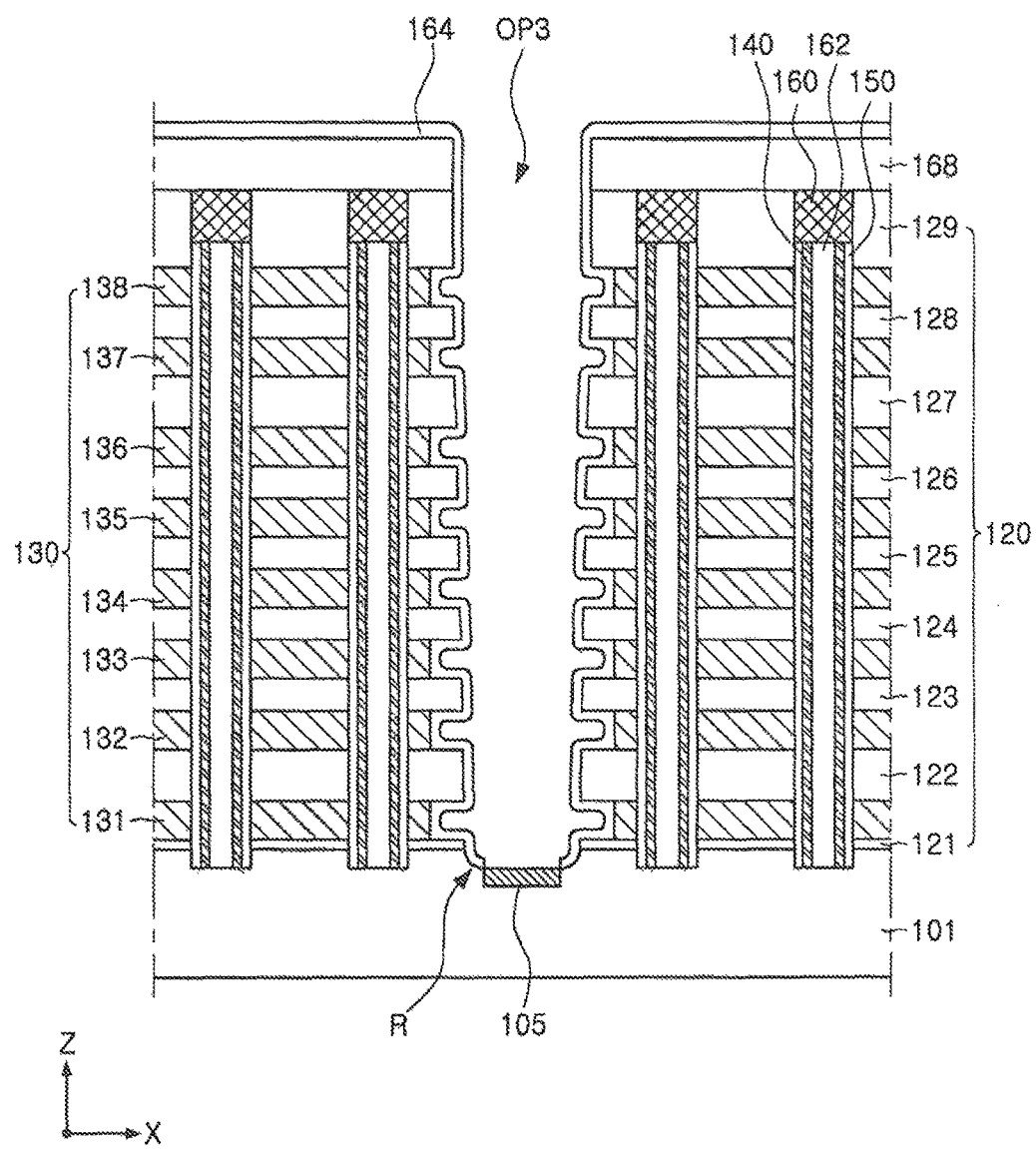

Referring to FIG. 15, a portion of the spacer layer 164 formed on the recess R may be removed, and an impurity may be implanted in the substrate 101 within the third opening OP3 to form an impurity region 105.

In some exemplary embodiments, after the impurity region 10 is formed, a portion of the spacer layer 164 may be removed.

Figure 16:
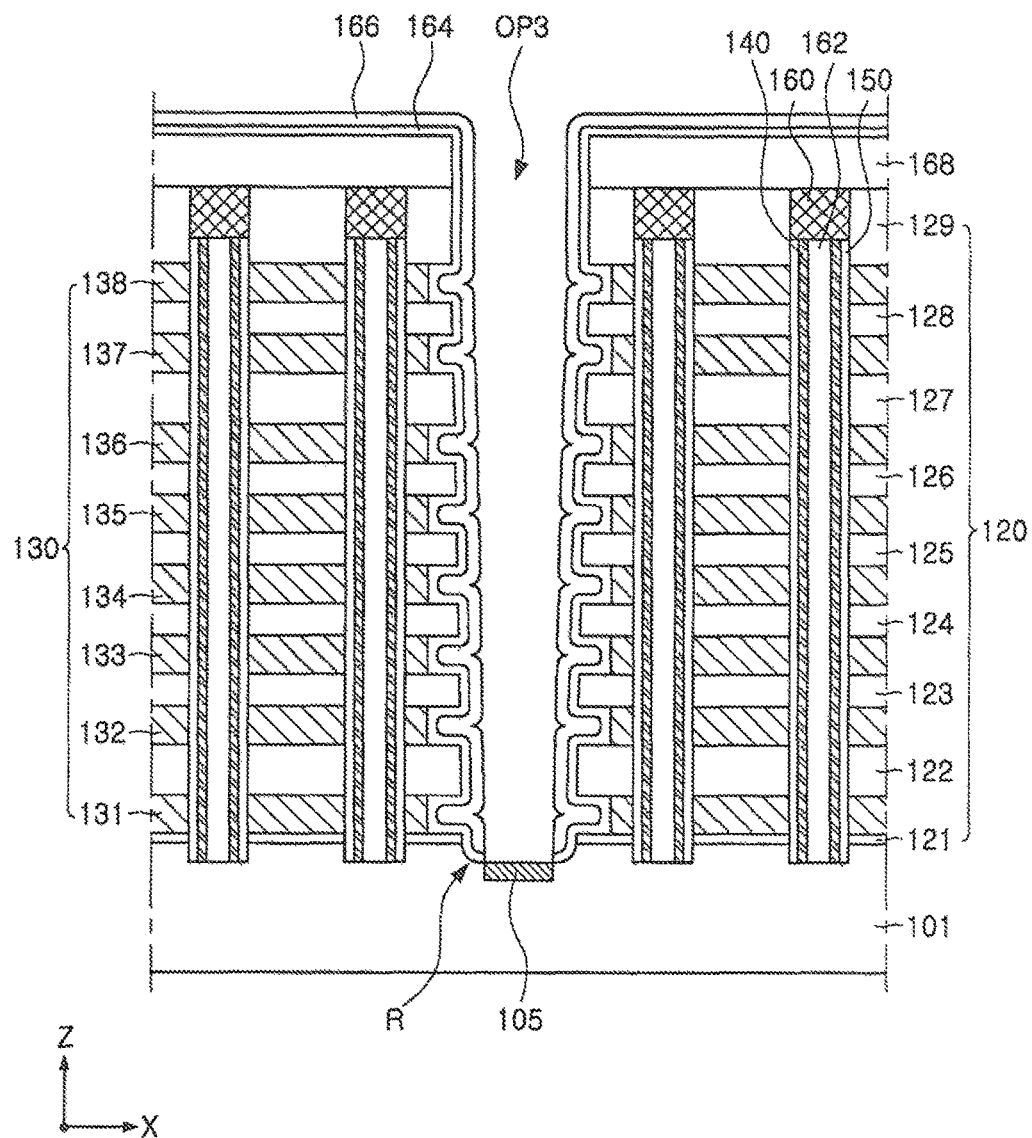

Referring to FIG. 16, a barrier layer 166 may be formed on the spacer layer 164 and the impurity region 105. After the formation of the barrier layer 166, a portion of the barrier layer 166 may be removed so that an upper surface of the impurity region 105 may be exposed. Since the barrier layer 166 is formed along the shape of the spacer layer 164, the barrier layer 166 may be uneven.

In FIG. 16, it is illustrated that one surface of the barrier layer 166 exposed to the third opening OP3 is aligned with a side surface of the impurity region 105, but a thickness and disposition of the barrier layer 166 are not limited to the illustrated thicknesses.

Also, in the exemplary embodiments, the procedure illustrated in FIGS. 14 through 16 may not be sequentially performed. For example, after the spacer layer 164 and the barrier layer 166 are formed, portions of the barrier layer 166 and the spacer layer 164 formed on the upper surface of the recess R may be removed to expose the substrate 101. Thereafter, an impurity may be implanted in the exposed upper surface of the substrate 101 to form the impurity region 105.

Figure 17:
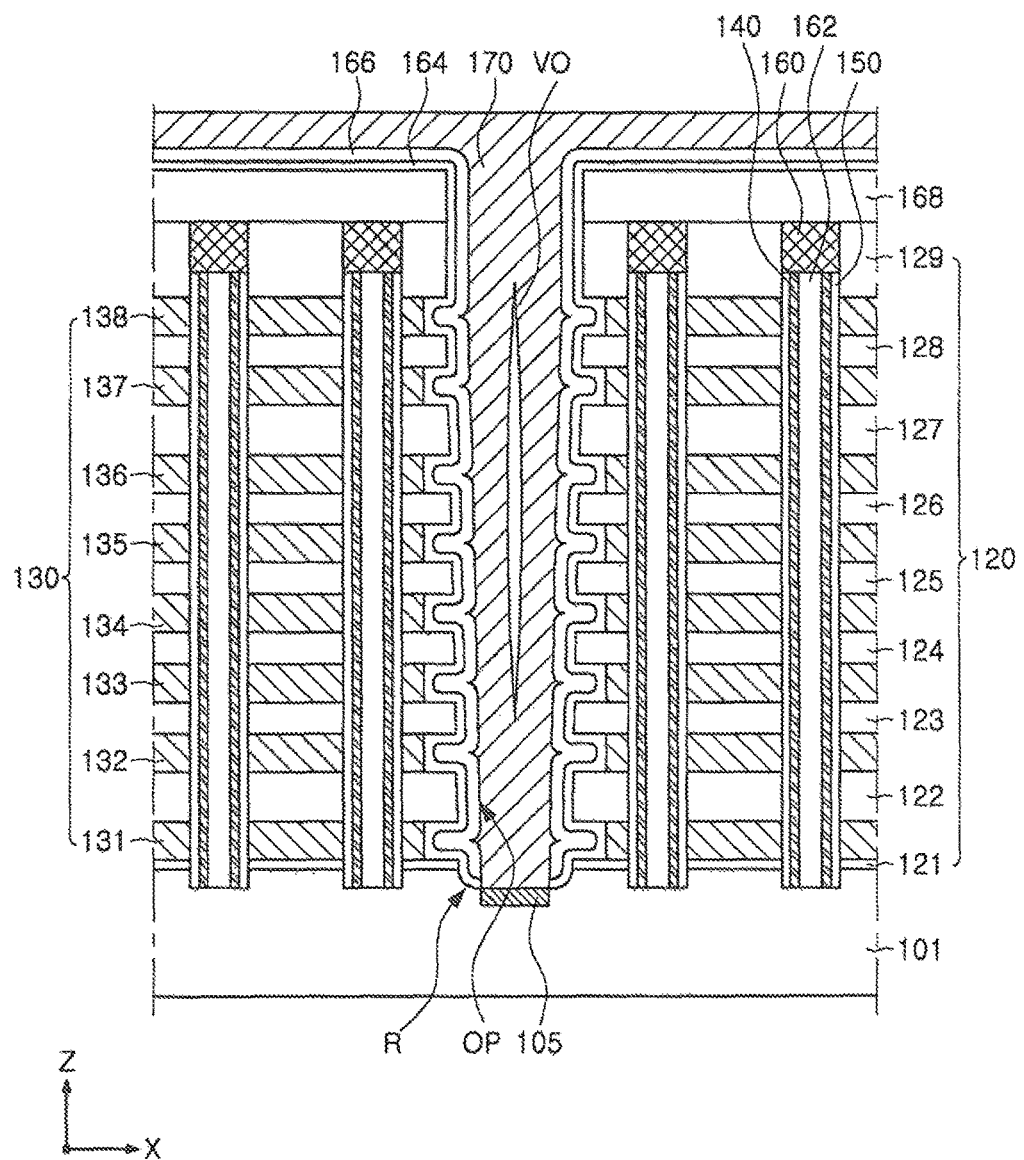

Referring to FIG. 17, a conductive layer 170 may be formed within the opening OP defined by the barrier layer 66 and the upper surface of the impurity region 105 A portion of the conductive layer 170 filling the opening OP may form an outer side wall along the shape of the barrier layer 166, having an uneven pattern.

Before the formation of the conductive layer 170, a diffusion barrier may be further formed on the barrier layer 166. The diffusion barrier may include a nitride such as TiN or WN.

In a case in which the opening OP has a width decreased toward the substrate 101 due to a high aspect ratio thereof, the void VO may be formed during a process of forming the conductive layer 170. Here, an acidic gas may be present within the void VO. The acidic gas may be generated by reacting as an element forming a source material of the conductive layer 170 (for example, fluorine when a source material of the conductive layer 170 is tungsten hexafluoride $WF_6$) to a hydrogen gas when the conductive layer 170 is formed through CVD or ALD. The acidic gas confined in the void VO may be outgassed in a follow-up process. Since the barrier layer 166 has tolerance to the gas, damage to the spacer layer 164 and the gate electrodes 130 may be prevented.

Thereafter, the upper insulating layer 168, a portion of the spacer layer 164 formed on the upper insulating layer 168, a portion of the barrier layer 166 formed on the upper insulating layer 168 and a portion of the conductive layer 170 may be removed through a planarization process so that an upper surface of the channel pad 160 is exposed.

The planarization process may be, for example, a chemical mechanical polishing (CMP) process.

Figure 18:
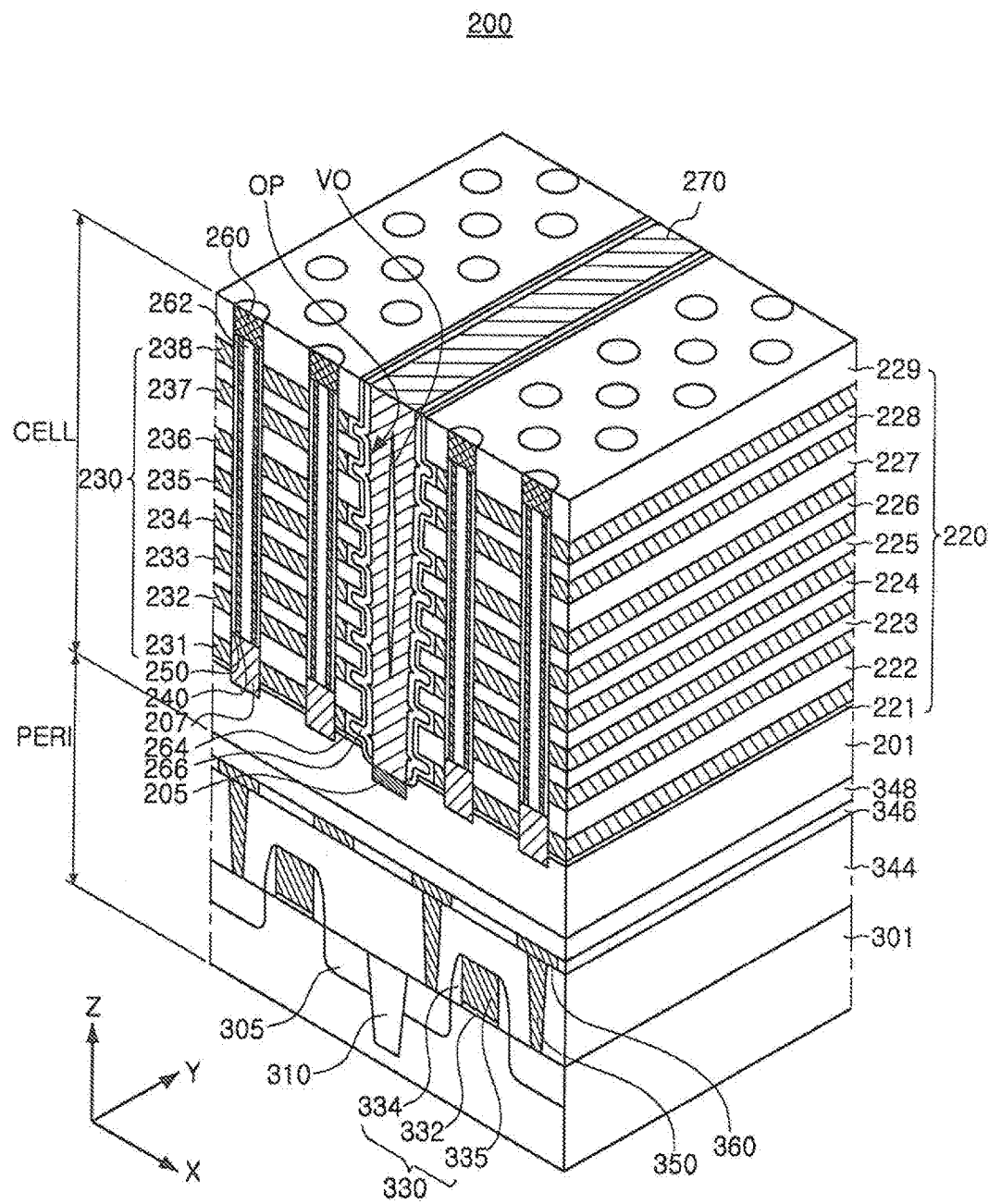
FIG. 18 is a perspective view schematically illustrating a semiconductor apparatus according an exemplary embodiment of the present inventive concept.

FIG. 18 is a perspective view schematically illustrating a semiconductor apparatus according an exemplary embodiment of the present inventive concept.

Referring to FIG. 18, the semiconductor apparatus 200 may include a cell region CELL and a peripheral circuit region PERI.

The cell region CELL may correspond to a region in which the memory cell array 20 of FIG. 1 is disposed, and the peripheral circuit region PERI may correspond to a region in which the driving circuit 30 of the memory cell array 20 is disposed. The cell region CELL may be disposed above the peripheral circuit region PERI. In exemplary embodiments, the cell region CELL may be disposed below the peripheral circuit region PERI.

The cell region CELL may include a plurality of channel regions 240 disposed in a direction perpendicular to an upper surface of a substrate 201, an epitaxial layer 207 disposed below the channel regions 240, and a plurality of interlayer insulating layers 220 and a plurality of gate electrodes 230 stacked along an outer side wall of the channel regions 240. Also, the semiconductor apparatus 200 may further include a gate dielectric layer 250 disposed between the channel region 240 and the gate electrode 230, a channel pad 260 above the channel region 240, an impurity region 205, a conductive layer 270 on the impurity region 205, and a barrier layer 266 and a spacer layer 264 sequentially disposed on the conductive layer 270.

The epitaxial layer 207 may be disposed on the substrate 201 below the channel regions 240 and may be disposed on a side surface of at least one gate electrode 230. The epitaxial layer 207 may be disposed in a recessed region of the substrate 201. A height of an upper surface of the epitaxial layer 207 may be higher than an upper surface of a lowermost gate electrode 231 and may be lower than a lower surface of the gate electrode 232 above the gate electrode 231. Even if an aspect ratio of the channel region 240 is increased, the channel region 240 may be stably electrically connected to the substrate 201 through the epitaxial layer 207, and characteristics of the ground select transistors GST (refer to FIG. 2) between the memory cell strings may become uniform.

The epitaxial layer 207 may be a layer formed using selective epitaxial growth (SEG). The epitaxial layer 207 may be configured as a single layer or a plurality of layers. The epitaxial layer 207 may include polycrystalline silicon, single crystal silicon, polycrystalline germanium or single crystal germanium, which is doped with an impurity or undoped. For example, when the substrate 201 is single crystal silicon, the epitaxial layer 207 may be single crystal silicon. However, in an exemplary embodiment, even though the substrate 201 is single crystal silicon, at least a portion of the epitaxial layer 207 may have a polycrystalline silicon structure including a plurality of crystal grains.

In the present exemplary embodiment, the cell region CELL is illustrated to have the same structure as that of the exemplary embodiment of FIG. 3, except for the epitaxial layer 207, but the structure of the cell region CELL is not limited thereto. The cell region CELL may include semiconductor apparatuses according to various exemplary embodiments described above with reference to FIGS. 5 through 8, for example. Also, the epitaxial layer 207 of the present exemplary embodiment may also be applied to various exemplary embodiments described above with reference to FIGS. 3 and 5 to 8.

The peripheral circuit region PERI may include a base substrate 301, and circuit elements 330, contact plugs 350, and wiring lines 360 disposed on the base substrate 301.

The base substrate 301 may have an upper surface extending in the x and y directions. On the base substrate 301, an isolation layer 310 may be formed to define an active region.

A doped region 305 including an impurity may be disposed in a portion of the active region. The base substrate 301 may include a semiconductor material, such as, but not limited to, a Group IV semiconductor, a Group III-V compound semiconductor, or a Group II-VI oxide semiconductor.

The circuit elements 330 may include a planar transistor. The circuit elements 330 may include a circuit gate insulating layer 332, a spacer layer 334, and a circuit gate electrode 335. The doped regions 305 are disposed on both sides of the circuit gate electrode 335 in the base substrate 301 to act as a source region and a drain region of the circuit element 330.

A plurality of peripheral region insulating layers 344, 346, and 348 may be disposed on the circuit element 330 on the base substrate 301.

After the peripheral circuit region PERI is first manufactured, the substrate 201 of the cell region CELL is formed thereabove to manufacture the cell region CELL. The substrate 201 may have a size equal to that of the base substrate 301 or may be smaller than the base substrate 301. The substrate 201 may be formed of polycrystalline silicon or may be formed of amorphous silicon and subsequently single-crystallized.

The cell region CELL and the peripheral circuit region PERI may be connected in a region. For example, one ends of the gate electrodes 230 in the y direction may be electrically connected to the circuit element 330.

Figure 19:
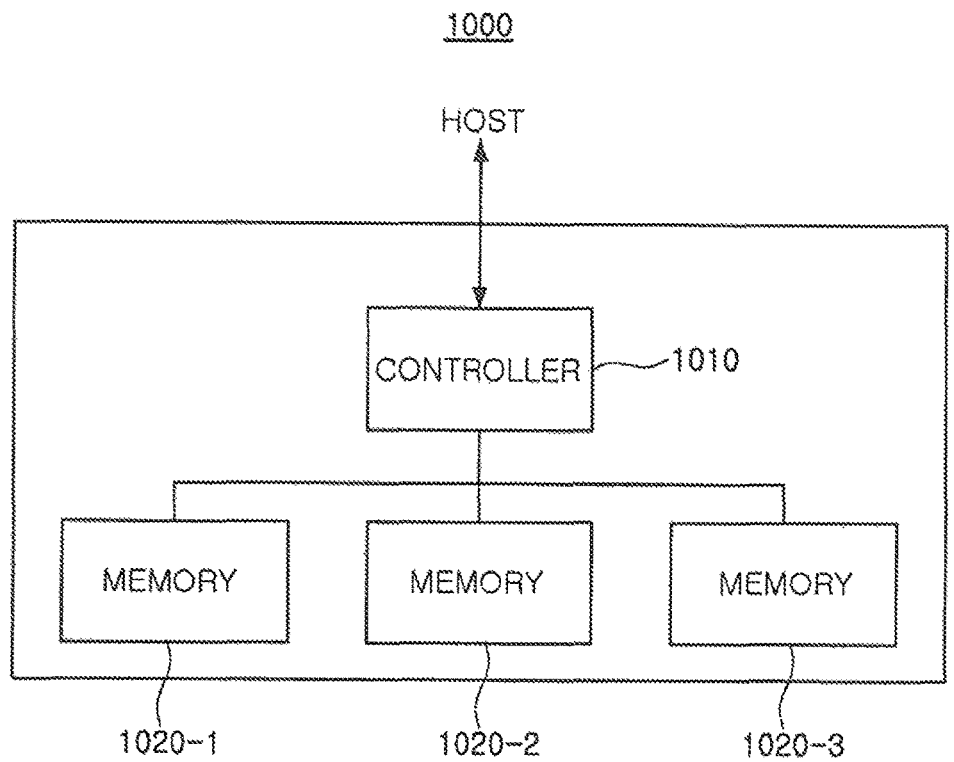
FIG. 19 is a block diagram illustrating a storage device including a semiconductor apparatus according to an exemplary embodiment of the present inventive concept.

FIG. 19 is a block diagram illustrating a storage device including a semiconductor apparatus according to an exemplary embodiment of the present inventive concept.

Referring to FIG. 19, a storage device 1000 may include a controller 1010 communicating with a host HOST and memories 1020-1, 1020-2, and 1020-3 storing data. Each of the memories 1020-1, 1020-2, and 1020-3 may include the semiconductor apparatuses according to various exemplary embodiments of the present inventive concept as described above with reference to FIGS. 3 through 8.

The host HOST communicating with the controller 1010 may be various electronic devices in which the storage device 100 is installed. For example, the host HOST may be a smartphone, a digital camera a desktop computer, a laptop computer, a media player, or the like. When a data write or read request is received from the host HOST, the controller 1010 may generate a command for storing data in the memories 1020-1, 1020-2, and 1020-3 or retrieving data from the memories 1020-1, 1020-2, and 1020-3.

As illustrated in FIG. 19, one or more memories 1020-1, 1020-2, and 1020-3 may be connected to the controller 1010 in parallel within the storage device 1000. By connecting the plurality of memories 1020-1, 1020-2 and 1020-3 to the controller 1010 in parallel, the storage device 1000 having large capacity, such as a solid state drive (SSD), may be implemented.

Figure 20:
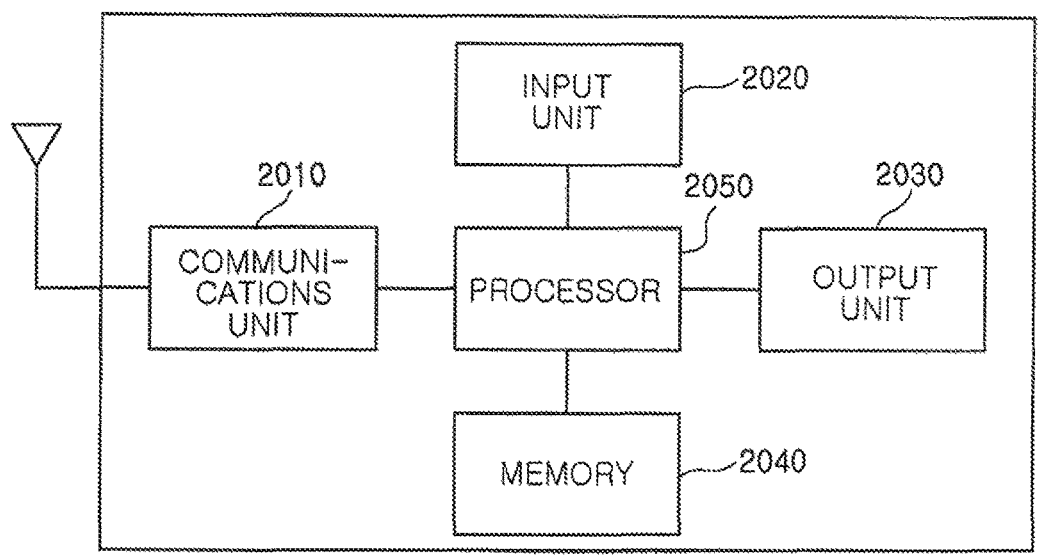
FIG. 20 is a block diagram illustrating an electronic device including a semiconductor apparatus according to an exemplary embodiment of the present inventive concept.

FIG. 20 is a block diagram illustrating an electronic device including a semiconductor apparatus according to an exemplary embodiment of the present inventive concept.

Referring to FIG. 20, an electronic device 2000 according to the present exemplary embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, and the like. A wired/wireless communications module included in the communications unit 2010 may be connected to an external communication network based on various communication standards to transmit and receive data.

The input unit 2010, provided to allow a user to control an operation of the electronic device 2000, may include a mechanical switch, a touch screen, a voice recognition module, and the like. Also, the input unit 2010 may include a mouse or a finger mouse device operating in a track ball or a laser pointer manner, or the like. In addition, the input unit 2020 may further include various sensor modules allowing the user to input data.

The output unit 2030 outputs information processed by the electronic device 2000 in an audio or video format, and the memory 2040 may store a program for processing and controlling the processor 2050, data, or the like. The memory 2040 may include one or more semiconductor apparatuses according to various exemplary embodiments of the present inventive concept as described above. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In a case in which the memory 240 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of the components included in the electronic device 2000. The processor 2050 may perform controlling and processing related to an audio call, a video call, data communication, and the like, or may perform controlling and processing for multimedia playback and management. Also, the processor 2050 may process input delivered from the user through the input unit 2020 and output corresponding results through the output unit 2030. Further, as described above, the processor 2050 may store data required for controlling an operation of the electronic device 2000 to the memory 2040 or retrieve such data therefrom. At least one of the processor 2050 and the memory 2040 may include the semiconductor apparatus according to various exemplary embodiments described above with reference to FIGS. 3 through 8.

Figure 21:
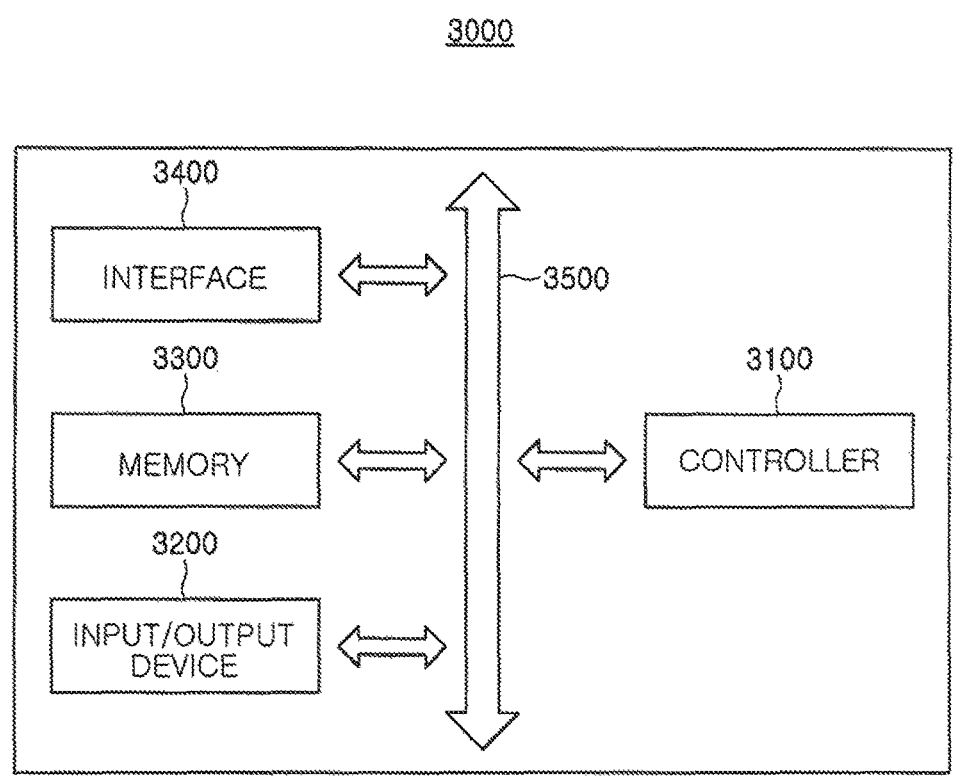
FIG. 21 is a block diagram illustrating a system including a semiconductor apparatus according to an exemplary embodiment of the present inventive concept.

FIG. 21 is a block diagram illustrating a system including a semiconductor apparatus according to an exemplary embodiment of the present inventive concept.

Referring to FIG. 21, a system 3000 may include a controller 3100, an input/output device 3200, a memory 3300, and an interface 3400. The system 3000 may be a mobile system or a system transmitting or receiving information. The mobile system may be a portable digital assistant (PDA), a portable computer, a tablet PC, a wireless phone, a mobile phone, a digital music player, or a memory card.

The controller 3100 may serve to execute a program and to control the system 3000. The controller 3100 may be, for example, a microprocessor, a digital signal processor, or a microcontroller, or any device similar thereto.

The input/output device 3200 may be used to input or output data of the system 3000. The system 3000 may be connected to an external device, for example, a personal computer or a network and exchange data therewith by using the input/output device 3200. The input/output device 3200 may be, for example, a keypad, a keyboard, or a display.

The memory 3300 may store codes and/or data for an operation of the controller 3100, and/or store data processed by the controller 3100. The memory 3300 may include the semiconductor apparatus according to any one of the exemplary embodiments of the present inventive concept.

The interface 3400 may be a data transmission passage between the system 3000 and an external device. The controller 3100, the input/output device 3200, the memory 3300, and the interface 3400 may communicate with each other through a bus 3500.

At least one of the controller 3100 and the memory 3300 may include the semiconductor apparatus according to various exemplary embodiments of the present inventive concept described above with reference to FIGS. 3 through 8.

As set forth above, according to exemplary embodiments of the present inventive concept, a semiconductor apparatus having improved reliability by preventing acidic gas, introduced from a void formed within a conductive layer, from being introduced to the gate electrodes or channel regions, is provided.

While exemplary embodiments have been shown and described above, it will be apparent to those skilled in the art that modifications and variations could be made without departing from the scope of the invention as defined by the appended claims.

What is claimed is:

1. A semiconductor apparatus comprising:
gate electrodes and interlayer insulating layers alternately stacked on a substrate;
channel regions penetrating through the gate electrodes and the interlayer insulating layers;
a gate dielectric layer between the gate electrodes and the channel regions comprising a tunneling layer, an electric charge storage layer, and a blocking layer;
a conductive layer extending from an uppermost layer among the interlayer insulating layers to the substrate by penetrating through the gate electrodes and the interlayer insulating layers between the channel regions, the conductive layer having an uneven pattern on an outer side wall thereof, and the conductive layer having a void therein;
a barrier layer disposed on the outer side wall of the conductive layer; and
a spacer layer disposed on a surface of the barrier layer, wherein the barrier layer and the spacer layer have different etch selectivities, and wherein the barrier layer and spacer layer are sequentially disposed on the outer side wall of the conductive layer between: a) the conductive layer; and b) the gate electrodes and interlayer insulating layers.

2. The semiconductor apparatus of claim 1, wherein the barrier layer is in direct contact with the conductive layer.

3. The semiconductor apparatus of claim 1, wherein a rate of acidification in hydrofluoric acid of the barrier layer is less than a rate of acidification in hydrofluoric acid of the spacer layer.

4. The semiconductor apparatus of claim 1, wherein the spacer layer comprises an oxide.

5. The semiconductor apparatus of claim 1, wherein the barrier layer comprises a nitride or an oxynitride.

6. The semiconductor apparatus of claim 5, wherein the barrier layer comprises silicon nitride or silicon oxynitride (SiON).

7. The semiconductor apparatus of claim 1, wherein an acid resistance of the barrier layer is class A or class AA by ASTM C 282.

8. The semiconductor apparatus of claim 1, wherein an etch rate of the barrier layer by hydrofluoric acid as an etchant is less than an etch rate of the spacer layer.

9. The semiconductor apparatus of claim 1, wherein a thickness of the spacer layer is greater than a thickness of the barrier layer.

10. The semiconductor apparatus of claim 1, wherein the spacer layer and the barrier layer do not comprise a material included in the gate electrodes.

11. A semiconductor apparatus comprising:
gate electrodes and interlayer insulating layers alternately stacked on a substrate;
channel regions penetrating through the gate electrodes and the interlayer insulating layers;
a conductive layer extending from an uppermost layer among the interlayer insulating layers to the substrate by penetrating through the gate electrodes and the interlayer insulating layers between the channel regions, the conductive layer having an uneven pattern on an outer side wall thereof; and
a plurality of layers disposed between: a) the conductive layer; and b) the gate electrodes and interlayer insulating layers in order to insulate the conductive layer from the gate electrodes comprising at least one spacer layer and at least one barrier layer,
wherein the at least one barrier layer has an etch selectivity different from etch selectivities of the other layers.

12. The semiconductor apparatus of claim 11, wherein the plurality of layers comprise a first spacer layer, a barrier layer and a second spacer layer sequentially disposed on the outer side wall of the conductive layer, wherein the barrier layer is formed of a material having tolerance to an acidic gas.

13. The semiconductor apparatus of claim 11, wherein the at least one barrier layer is formed of a material having tolerance to a hydrofluoric acid gas.

14. The semiconductor apparatus of claim 11, wherein the at least one barrier layer is formed of a nitride or an oxynitride.

15. The semiconductor apparatus of claim 11, wherein the at least one spacer layer comprises an oxide.

16. The semiconductor apparatus of claim 11, wherein
the plurality of layers comprise a plurality of barrier layers and a plurality of spacer layers,
each of the plurality of barrier layers is alternately disposed with each of the plurality of spacer layers,
wherein the plurality of barrier layers are formed of a material having tolerance to an acidic gas.

17. The semiconductor device of claim 16, wherein the plurality barrier layers comprise a material having tolerance to hydrofluoric acid gas.

18. The semiconductor apparatus of claim 16, wherein the plurality of barrier layers comprise a nitride or an oxynitride.

19. The semiconductor apparatus of claim 16, wherein the plurality of spacer layers comprise an oxide.

20. A semiconductor apparatus comprising:
gate electrodes and interlayer insulating layers alternately stacked on a substrate;
channel regions penetrating through the gate electrodes and the interlayer insulating layers;
a gate dielectric layer between the gate electrodes and the channel regions comprising a tunneling layer, an electric charge storage layer, and a blocking layer;
a conductive layer extending from an uppermost layer among the interlayer insulating layers to the substrate by penetrating through the gate electrodes and the interlayer insulating layers between the channel regions, the conductive layer having an uneven pattern on an outer side wall thereof, and the conductive layer having a void therein, wherein the uneven pattern comprises a seam on an outer side wall thereof opposite the gate electrode;
a barrier layer disposed on the outer side wall of the conductive layer; and
a spacer layer disposed on a surface of the barrier layer, wherein the barrier layer and the spacer layer have different etch selectivities, and wherein the barrier layer and spacer layer are sequentially disposed on the outer side wall of the conductive layer between: a) the conductive layer; and b) the gate electrodes and interlayer insulating layers.

* * * * *